United States Patent
Suzuki et al.

(10) Patent No.: US 10,849,261 B2
(45) Date of Patent: Nov. 24, 2020

(54) SURFACE MOUNTER AND METHOD OF CORRECTING RECOGNITION ERROR

(71) Applicant: Yamaha Hatsudoki Kabushiki Kaisha, Iwata (JP)

(72) Inventors: Yasuhiro Suzuki, Iwata (JP); Junji Yamaguchi, Iwata (JP)

(73) Assignee: YAMAHA HATSUDOKI KABUSHIKI KAISHA, Shizuoka (JP)

(*) Notice: Subject to any disclaimer, the term of this patent is extended or adjusted under 35 U.S.C. 154(b) by 125 days.

(21) Appl. No.: 16/076,640

(22) PCT Filed: Feb. 10, 2016

(86) PCT No.: PCT/JP2016/053951
§ 371 (c)(1),
(2) Date: Aug. 8, 2018

(87) PCT Pub. No.: WO2017/138113
PCT Pub. Date: Aug. 17, 2017

(65) Prior Publication Data
US 2019/0045683 A1    Feb. 7, 2019

(51) Int. Cl.
*H05K 13/08* (2006.01)
*G06K 9/03* (2006.01)

(52) U.S. Cl.
CPC .......... *H05K 13/0812* (2018.08); *G06K 9/03* (2013.01); *H05K 13/089* (2018.08); *H05K 13/0815* (2018.08); *H05K 13/0818* (2018.08)

(58) Field of Classification Search
CPC ............. H05K 13/0812; H05K 13/089; H05K 13/0818; H05K 18/0815; G06K 9/03
See application file for complete search history.

(56) References Cited

U.S. PATENT DOCUMENTS

2006/0048380 A1* 3/2006 Okuda ............... H05K 13/083
                                                    29/832
2010/0220183 A1* 9/2010 Yoro ................ H01L 21/67144
                                                    348/86
(Continued)

FOREIGN PATENT DOCUMENTS

JP    H11-295032 A    10/1999
JP    3253218 B2      2/2002
(Continued)

OTHER PUBLICATIONS

An Office Action mailed by the Japanese Patent Office dated Oct. 29, 2019, which corresponds to Japanese Patent Application No. 2017-566463 and is related to U.S. Appl. No. 16/076,640.
(Continued)

Primary Examiner — Zhitong Chen
(74) Attorney, Agent, or Firm — Studebaker & Brackett PC

(57) ABSTRACT

A surface mounter for mounting an electronic component on a printed circuit board includes a stage, a mounter, a camera, a mark, and a controller. The mounter is movable in a plane direction of the stage and mounts the electronic component on the printed circuit board. The camera is on the stage or mounter, and the mark is on the other of the stage or mounter. The controller executes processing to capture images of the mark at multiple positions in a field of view of the camera and perform image recognition; calculate correction values for correcting recognition errors at the recognition positions based on recognition of the mark; capture an image of the printed circuit board or the electronic component by the camera and perform image recognition; and correct results of the recognition of the printed circuit board or the electronic component based on the correction values.

3 Claims, 19 Drawing Sheets

(56) References Cited

U.S. PATENT DOCUMENTS

| | | | | |
|---|---|---|---|---|
| 2014/0141539 A1* | 5/2014 | Shinji | .............. | G01N 21/95684 |
| | | | | 438/7 |
| 2014/0300730 A1* | 10/2014 | Onishi | ............... | H05K 13/0818 |
| | | | | 348/95 |
| 2016/0150689 A1* | 5/2016 | Amano | ................ | H04N 5/2253 |
| | | | | 29/739 |

FOREIGN PATENT DOCUMENTS

| | | | |
|---|---|---|---|
| JP | 2007-012889 A | 1/2007 |
| JP | 4343710 B2 | 10/2009 |
| JP | 2010-087426 A | 4/2010 |
| JP | 2010-165892 A | 7/2010 |
| JP | 2011-180084 A | 9/2011 |
| JP | 2015-220419 A | 12/2015 |
| WO | 2015/004717 A1 | 1/2015 |

OTHER PUBLICATIONS

International Search Report issued in PCT/JP2016/053951; dated May 10, 2016.
An Office Action mailed by the State Intellectual Property Office of the People's Republic of China dated Nov. 20, 2019, which corresponds to Chinese Patent Application No. 201680080885.8 and is related to U.S. Appl. No. 16/076,640.

* cited by examiner

FIG.9

| RECOGNITION POSITION Py ON IMAGE SENSOR | CORRECTION VALUE (RECOGNITION ERROR) | |
|---|---|---|
| | X-AXIS DIRECTION | Y-AXIS DIRECTION |
| 20 | $CX_{20}$ | $CY_{20}$ |
| 15 | $CX_{15}$ | $CY_{15}$ |
| 10 | $CX_{10}$ | $CY_{10}$ |
| 5 | $CX_{5}$ | $CY_{5}$ |
| 0 | $CX_{0}$ | $CY_{0}$ |
| −5 | $CX_{-5}$ | $CY_{-5}$ |
| −10 | $CX_{-10}$ | $CY_{-10}$ |
| −15 | $CX_{-15}$ | $CY_{-15}$ |
| −20 | $CX_{-20}$ | $CY_{-20}$ |

FIG.18

| RECOGNITION POSITION Py ON IMAGE SENSOR | CORRECTION VALUE (RECOGNITION ERROR) ||
|---|---|---|
| | X-AXIS DIRECTION | Y-AXIS DIRECTION |
| 20 | $CX1_{20} \Rightarrow CX2_{20}$ | $CY1_{20} \Rightarrow CY2_{20}$ |
| 15 | $CX1_{15} \Rightarrow CX2_{15}$ | $CY1_{15} \Rightarrow CY2_{15}$ |
| 10 | $CX1_{10} \Rightarrow CX2_{10}$ | $CY1_{10} \Rightarrow CY2_{10}$ |
| 5 | $CX1_{5} \Rightarrow CX2_{5}$ | $CY1_{5} \Rightarrow CY2_{5}$ |
| 0 | $CX1_{20} \Rightarrow CX2_{20}$ | $CY1_{20} \Rightarrow CY2_{20}$ |
| −5 | $CX1_{-5} \Rightarrow CX2_{-5}$ | $CY1_{-5} \Rightarrow CY2_{-5}$ |
| −10 | $CX1_{-10} \Rightarrow CX2_{-10}$ | $CY1_{-10} \Rightarrow CY2_{-10}$ |
| −15 | $CX1_{-15} \Rightarrow CX2_{-15}$ | $CY1_{-15} \Rightarrow CY2_{-15}$ |
| −20 | $CX1_{-20} \Rightarrow CX2_{-20}$ | $CY1_{-20} \Rightarrow CY2_{-20}$ |

SURFACE MOUNTER AND METHOD OF CORRECTING RECOGNITION ERROR

CROSS-REFERENCE TO RELATED APPLICATION

This application is a National Stage of International Patent Application No. PCT/JP2016/053951, filed Feb. 10, 2016, the entire content of which is incorporated herein by reference.

BACKGROUND

Technical Field

The technology disclosed herein relates to a technology for improving accuracy in recognition by a camera.

Background Art

A known surface mounter includes a camera for image recognition of an electronic component vacuum-held by a mounting head or reference marks on a printed circuit board.

Japanese Patent Application Publication No. 2010-165892 discloses a technology for reducing a deviation of an electronic component from a mounting positions. The deviation may result from a variation in pixel rate of a camera due to a variation in temperature. If the variation in temperature occurs, the camera is moved until the camera comes into focus and a position at which the camera is in focus is measured. A difference between a reference focus position and the measured position is calculated and the pixel rate is updated. As a result, the deviation of the electronic component from mounting position resulting from the variation in pixel rate due to the variation in temperature is reduced.

SUMMARY

Recognition errors of the camera may differ depending on recognition positions. A distortion of a lens or a mirror may be a cause of such a difference. In general, the recognition error is greater in an area farther from the center of the camera in comparison to the center. To improve accuracy in recognition by the camera, it is preferable to reduce the recognition error that depends on the recognition positions of the camera.

The technology described herein was made in view of the foregoing circumstances, and thus improves accuracy in mounting of electronic components on a printed circuit board by reducing recognition errors that depend on recognition positions of a camera to improve accuracy in recognition by a camera.

A surface mounter for mounting an electronic component on a printed circuit board includes a stage, a mounting portion, a camera, a mark, and a control portion. The mounting portion is configured to be movable in a planar direction of the stage and to mount the electronic component on the printed circuit board. The camera is provided on either one of the stage and the mounting portion. The mark is provided on one of the stage and the mounting portion on which the camera is not provided. The control portion is configured to execute a mark recognition process, a correction value calculating process, a mounting related component recognition process, and a correction process. The mark recognition process includes capturing images of the mark at multiple positions in a field of view of the camera and performing image recognition. The correction value calculating process includes calculating correction values for correcting recognition errors at recognition positions based on results of the recognition obtained through the mark recognition process. The mounting related component recognition process includes capturing an image of the printed circuit board or the electronic component by the camera and performing image recognition. The correction process includes correcting results of the recognition of the printed circuit board or the electronic component based on the correction values. The recognition positions are positions of the images on an imaging area of the camera.

According to the configuration, recognition errors that depend on the positions of the recognition by the camera are reduced and thus accuracy in recognition by the camera improves, that is, accuracy in mounting of the electronic component on the printed circuit board improves.

Preferable embodiments of the surface mounter described herein may include the following configurations.

The control portion may be configured to execute a mark recognition process for update, and a correction value update process. The mark recognition process for update may include capturing images of the mark by the camera again and performing image recognition if a predefined time has elapsed since previous recognition of the mark by the camera. The correction value update process may include updating the correction values for the recognition positions based on the recognition results of the mark obtained through the mark recognition process for update. According to the configuration, recognition errors by the component recognition camera resulting from a variation in temperature can be reduced.

The camera may be a line sensor camera including a one-dimensional image sensor. The mark recognition process may include capturing images of the mark at multiple positions in a field of view of the line sensor camera and performing image recognition. The correction value update process may include defining an approximation straight line based on recognition results at the multiple positions obtained through the recognition process for update and the correction values before the update. The approximation straight line may be for approximation of recognition errors at the recognition positions after correction using the correction values before the update. The correction values at the recognition positions may be updated based on the defined approximation straight line and the correction values before the update. According to the configuration, the number of measuring points can be reduced and thus the correction data can be updated in a short period of time.

The mark may be provided on the mounting portion. The line sensor camera may be provided on the stage. The line sensor camera may be a component recognition camera configured to capture images of the electronic component held by the mounting portion. According to the configuration, the mark can be moved to a position corresponding to the camera using the mounting portion.

When a direction along a line of the line sensor camera is defined as a Y-axis direction and a direction perpendicular to the Y-axis direction is defined as an X-axis direction, the mounting portion may include multiple mounting heads arranged in the X-axis direction on either side of the mark in the Y-axis direction. The mark recognition process for update may include recognizing the mark at three positions including a center of the field of view and two capturing positions that are a predefined distance apart from the center of the field of view in the Y-axis direction. The distance between the center of the field of view and each of the capturing positions in the Y-axis direction may be equal to a distance between a center line of the mounting portion and the mounting head in the Y-axis direction. According to the configuration, the electronic component is recognized at the positions at which the recognition errors are measured and thus the recognition errors of the electronic component can be reduced.

According to the technology described herein, recognition errors that depend on recognition positions of a camera are reduced to improve accuracy in recognition by a camera and thus accuracy in mounting of an electronic component on a printed circuit board improves.

BRIEF DESCRIPTION OF THE DRAWINGS

FIG. 9 is a table illustrating correction data;

FIG. 18 is a table illustrating correction data;

DETAILED DESCRIPTION

First Embodiment

1. Overall Configuration of Surface Mounter

Figure 1:
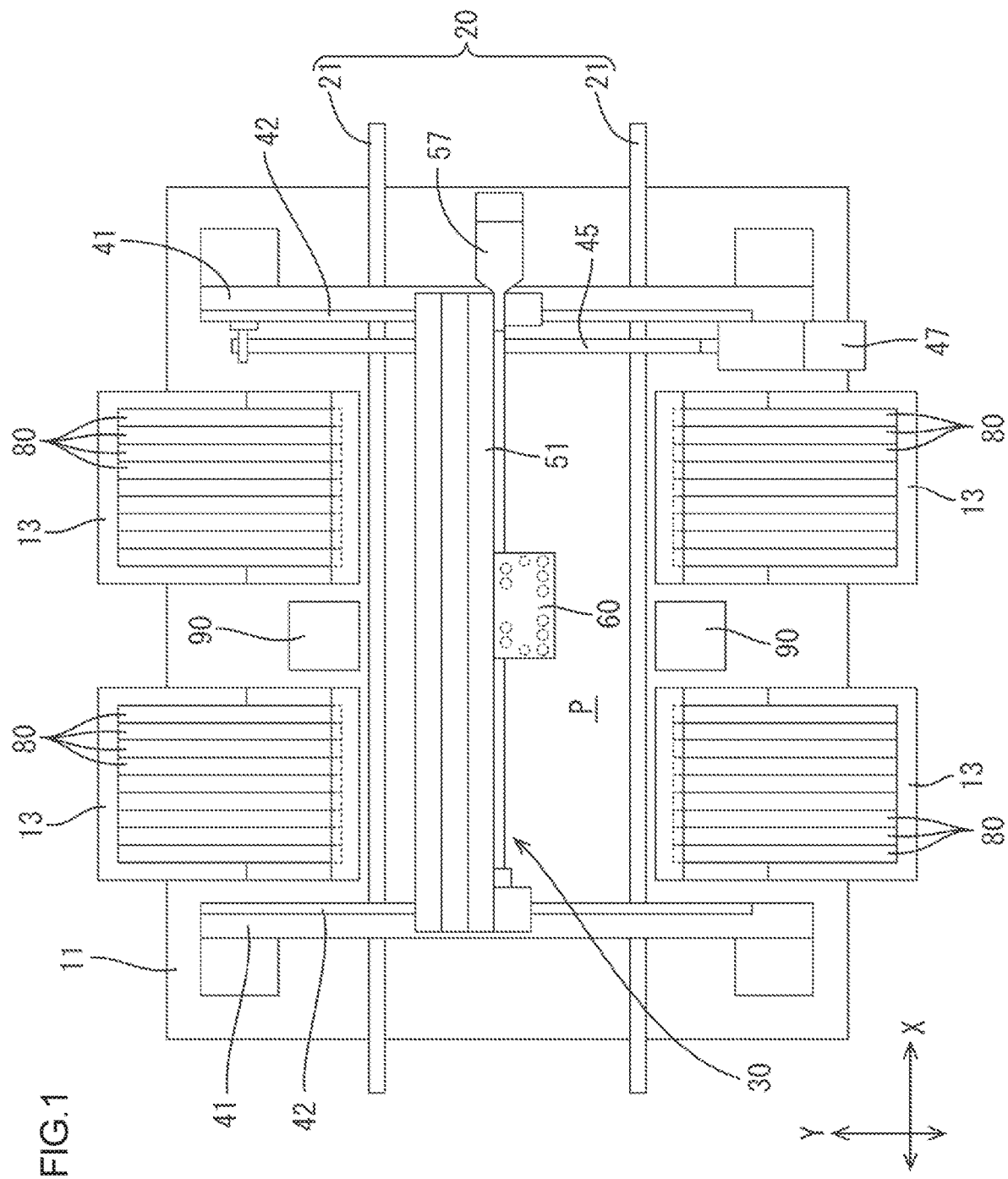
FIG. 1 is a plan view of a surface mounter according to a first embodiment.

As illustrated in FIG. 1, a surface mounter 1 includes a stage 11, a conveyer 20, a head unit 60, and a driving unit 30. The conveyer 20 transfers a print circuit board P. The driving unit 30 two-dimensionally moves the head unit 60 in a planar direction of the stage 11 (in the X-axis direction and the Y-axis direction) above the stage 11. In the following paragraphs, a longitudinal direction of the stage 11 (the horizontal direction in FIG. 1), a depth direction of the stage 11 (the vertical direction in FIG. 1), and the vertical direction in FIG. 2 may be referred to as the X-axis direction, the Y-axis direction, and the Z-axis direction, respectively. The head unit 60 corresponds to "a mounting portion" in the claimed disclosure. In this description, "mounting" means "mounting an electronic component on a printed circuit board."

The conveyer 20 is disposed at the center of the stage 11. The conveyer 20 includes a pair of conveyer belts 21 configured to turn in the X-axis direction. The printed circuit board P is held on the conveyer belts 21 with friction and transferred in the X-axis direction.

The printed circuit board P enters the surface mounter 1 from the left side in FIG. 1. The printed circuit board P is carried from the left side in FIG. 1 to the inside of the surface mounter 1 by the conveyer 20. The printed circuit board P is carried to a work area at the center of the stage by the conveyer 20 and stopped there.

Four component feeding portions 13 are disposed to surround the work area on the stage 11. The component feeding portions 13 include feeders 80 that feed electronic components B. The feeders 80 are arranged in the horizontal direction in each component feeding portion 13. The electronic components B and the printed circuit board P are examples of a mounting related component.

In the work area, a mounting process for mounting the electronic component B fed by the feeder 80 on the printed circuit board P with a mounting head 63 included in the head unit 60 is performed. After the mounting process is completed, the printed circuit board P is carried to the right side in FIG. 1 and to the outside of the surface mounter 1 by the conveyer 20.

The driving unit 30 includes at least a pair of supporting legs 41, a head support 51, a Y-axis ball screw 45, a Y-axis motor 47, an X-axis ball screw 55, and an X-axis motor 57. As illustrated in FIG. 1, the supporting legs 41 are disposed on the stage 11. The supporting legs 41 are located at edges of the work area and linearly extend in the Y-axis direction.

Guide rails 42 that extend in the Y-axis direction are disposed on upper surfaces of the supporting legs 41, respectively. The head support 51 is fixed to the guide rails with ends of the head support 51 engaged with the guide rails, respectively.

The Y-axis ball screw 45 that extends in the Y-axis direction is fixed to the supporting leg 41 on the right side and a ball nut (not illustrated) is screwed on the Y-axis ball screw 45. The Y-axis motor 47 is attached to the Y-axis ball screw 45.

When the Y-axis motor 47 is turned on, the ball nut moves backward along the Y-axis ball screw 45. As a result, the head support 51 fixed to the ball nut and the head unit 60, which will be described next, move in the Y-axis direction along the guide rail 42 (Y-axis servo mechanism).

Figure 2:
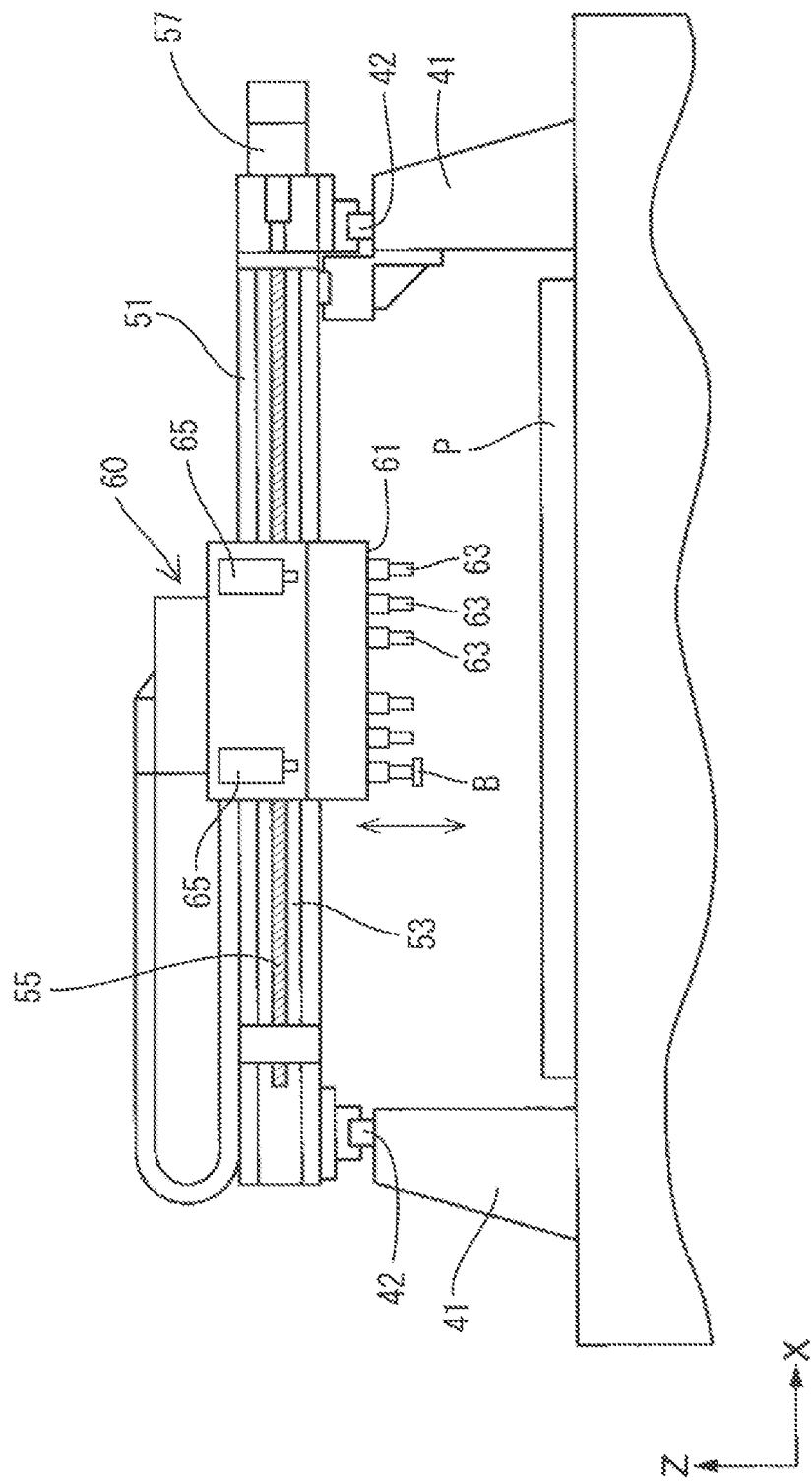
FIG. 2 is a view illustrating a supporting structure of a head unit.

The head support 51 has an elongated shape extending in the X-axis direction. As illustrated in FIG. 2, a guide member 53 that extends in the X-axis direction is disposed on the head support 51. The head unit 60 is attached to the guide member 53 to be movable along the axis of the guide member 53. The X-axis ball screw 55 that extends in the X-axis direction is attached to the head support 51. A ball nut is screwed on the X-axis ball screw 55.

The X-axis motor 57 is attached to the X-axis ball screw 55. When the X-axis motor 57 is turned on, the ball nut moves backward along the X-axis ball screw 55. As a result, the head unit 60 fixed to the ball nut moves in the X-axis direction along the guide member 53 (X-axis servo mechanism). Through mutual control of the X-axis motor 57 and the Y-axis motor 47, two-dimensional movement of the head unit 60 on the stage 11 (on the X-Y plane) is possible.

Figure 6:
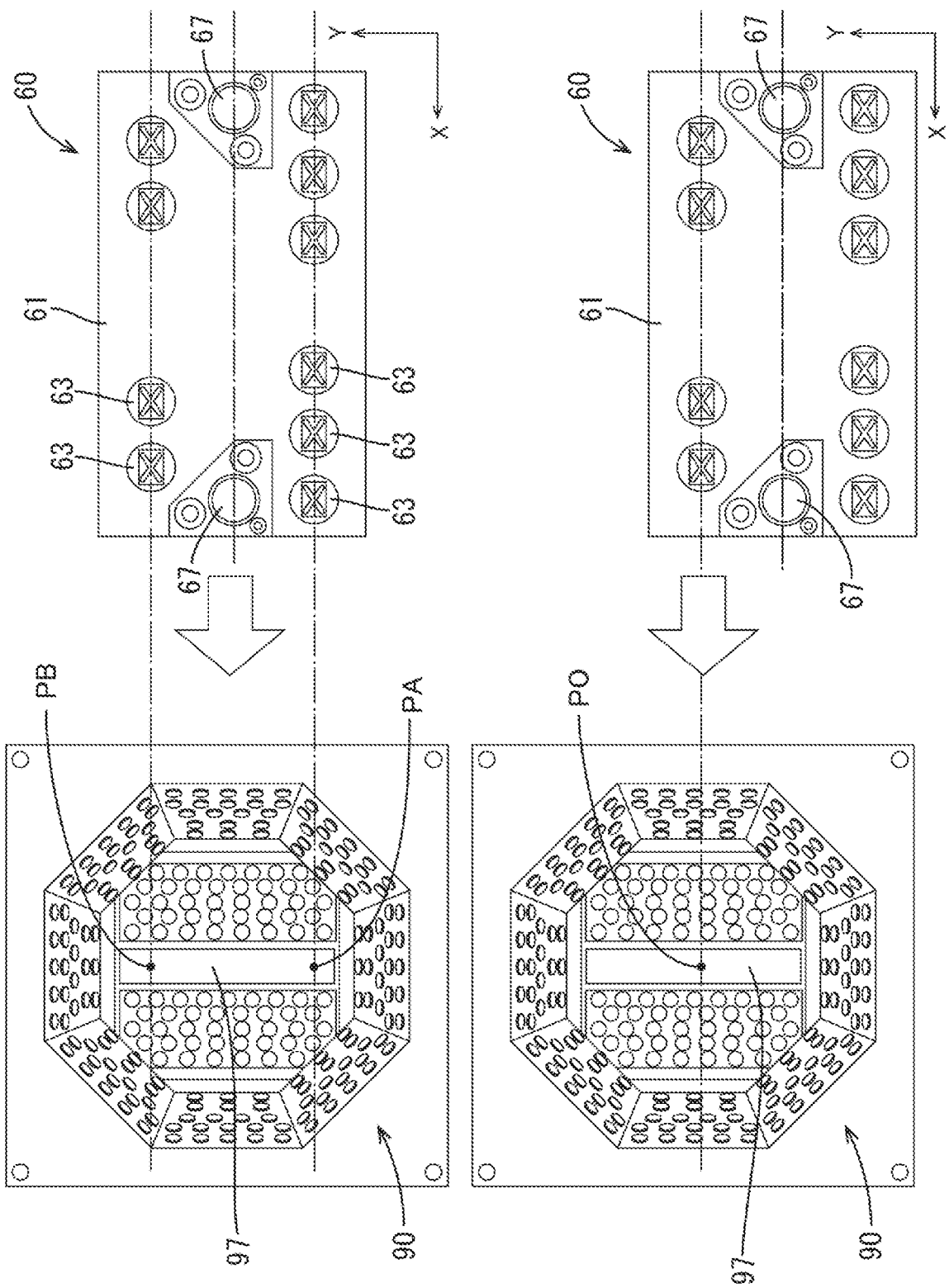
FIGS. 6A and 6B are views illustrating a method of recognizing an electronic component by a camera.

The head unit 60 includes mounting heads 63 with which the electronic components are mounted. As illustrated in FIGS. 6A and 6B, the mounting heads 63 are arranged at equal intervals in the X-axis direction. The mounting heads 63 are arranged in two lines that are away from each other in the Y-axis direction with marks 67 between the lines.

The marks 67 are on a lower wall of the head unit 60. The marks 67 are provided for correcting recognition errors of component recognition cameras 90 (the marks 67 will be described in detail later).

Each mounting head 63 is rotatable about an axis by an R-axis motor and movable up and down relative to the head unit 60 by the Z-axis motor. A negative pressure is applied to each mounting head 63 by a negative pressure application member, which is not illustrated. With the negative pressure, suction power is produced at a tip of the head. By operating the X-axis motor 57, the Y-axis motor 47, and the Z-axis motor at predefined timing, each electronic component B fed by the feeder 80 is extracted by the mounting head 63 and mounted on the printed circuit board P.

Reference sign 65 in FIG. 2 denotes a board recognition camera. The board recognition camera 65 is fixed to the head unit 60 with an imaging area facing the head unit 60. The board recognition camera 65 moves together with the head unit 60. The board recognition camera 65 captures an image of the printed circuit board and performs image recognition.

Figure 3:
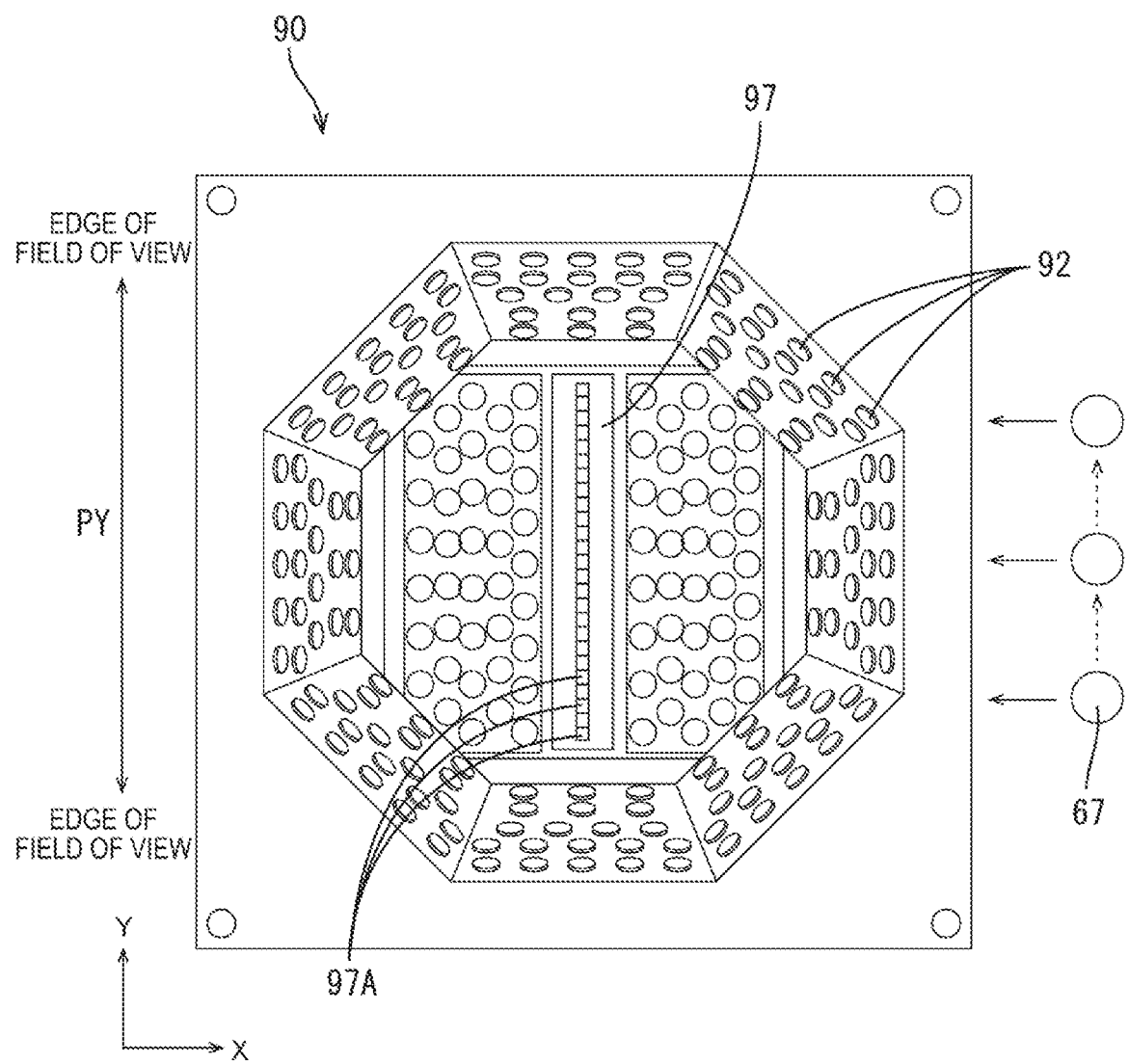
FIG. 3 is a plan view of a component recognition camera.

Reference signs "90" in FIGS. 1 and 3 denote the component recognition cameras. The component recognition cameras 90 are fixed to the stage 11 with imaging areas facing up. The component recognition cameras 90 capture images of the electronic components B vacuum-held by the mounting heads 63 and determine angles of the electronic components B.

Figure 4:
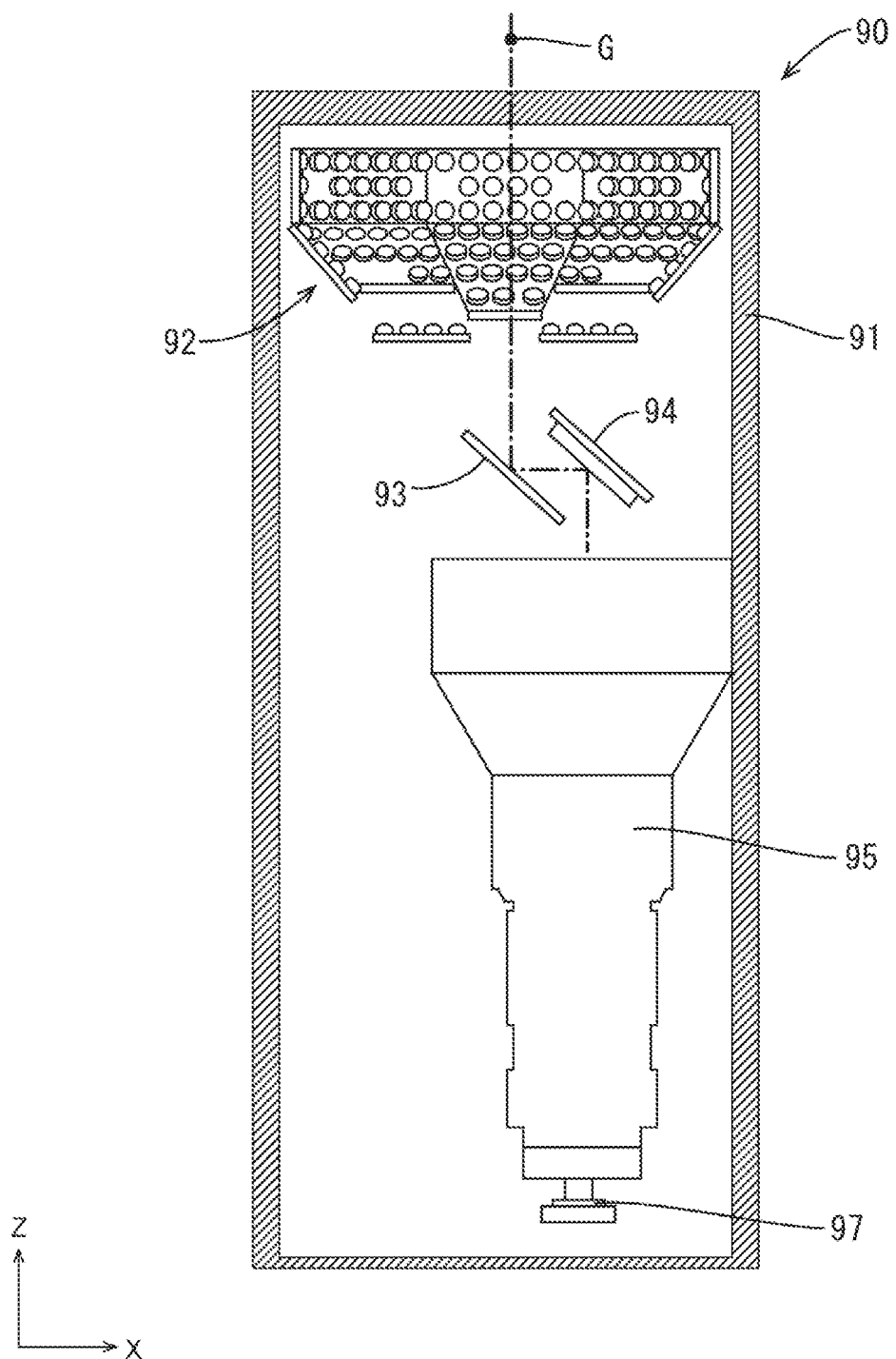
FIG. 4 is a vertical cross-sectional view of the component recognition camera.

Specifically, as illustrated in FIG. 4, the component recognition cameras 90 each include frames 91, light sources 92, first mirrors 93, second mirrors 94, lenses 95, and image sensors 97. The light sources 92 illuminate objects (the electronic components B).

As illustrated in FIG. 4, a light beam G that has entered the component recognition camera 90 reflects off the first mirror 93 and the second mirror 94, passes through the lens 95, and enters the image sensor 97. By capturing an image of the electronic component B when the electronic component B is right above the component recognition camera 90 during the transfer of the electronic component B, the image of the electronic component B is obtained.

The component recognition cameras 90 are line sensor cameras. As illustrated in FIG. 3, each image sensor 97 (an image capturing portion) is a one-dimensional image sensor including photosensitive elements 97A linearly arranged in the Y-axis direction. In this embodiment, the image capturing of each electronic component B is performed by the component recognition camera 90 at multiple consecutive times while the electronic component B is being moved in the X-axis direction over the component recognition camera 90. One-dimensional images of the electronic component B obtained through the multiple consecutive times of image capturing are arranged in the X-axis direction to obtain a two-dimensional reflected image of the electronic component B.

Figure 5:
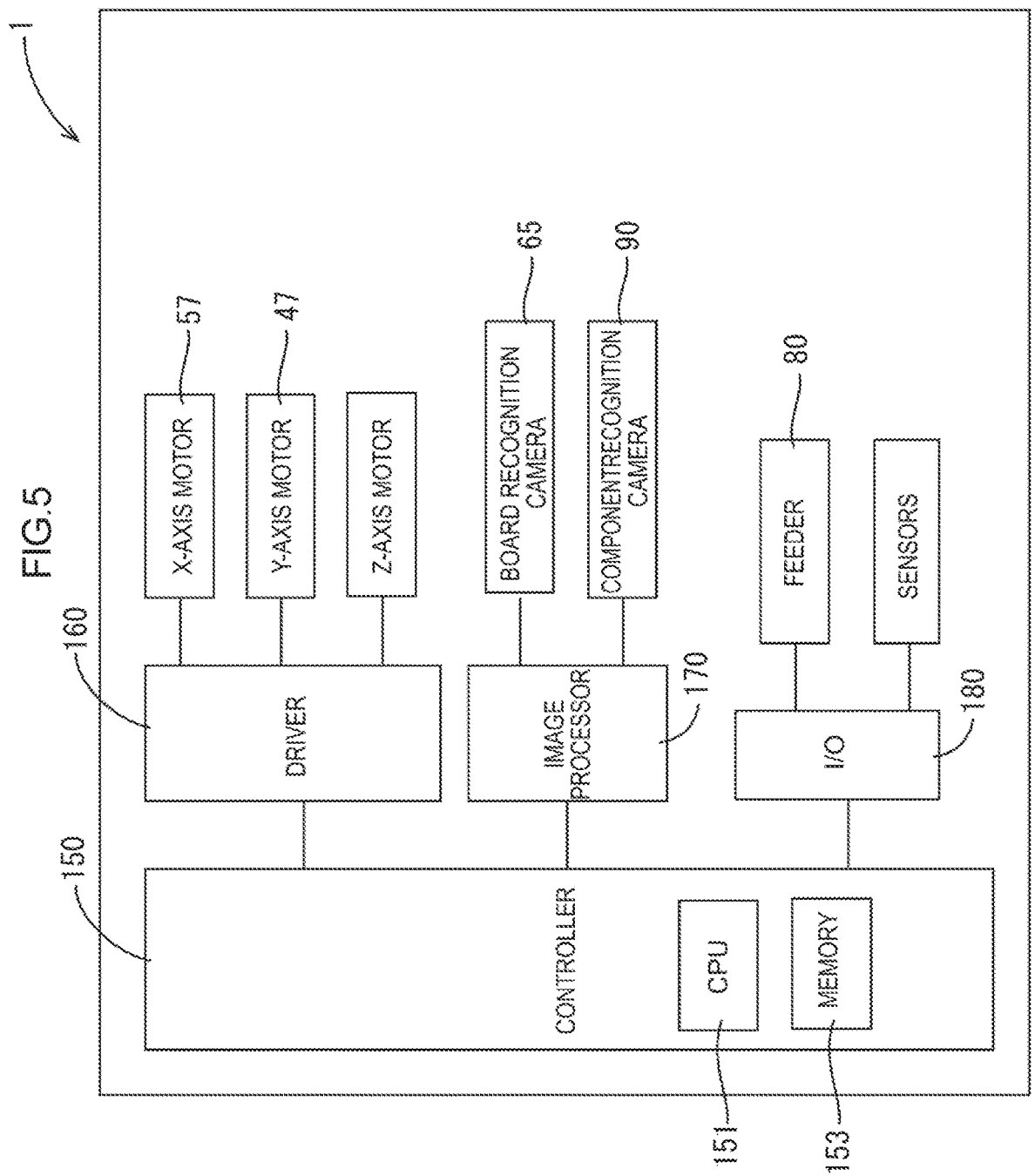
FIG. 5 is a block diagram illustrating an electric configuration of the surface mounter.

FIG. 5 is a block diagram illustrating an electric configuration of the surface mounter 1. The surface mounter 1 includes a controller 150, a driver 160, an image processor 170, and an I/O 180.

The controller 150 includes a CPU 151 and a memory 153. The memory 153 stores various kinds of information for mounting the electronic components B on the printed circuit board P including a mounting program. The memory 153 stores correction data for correcting the recognition errors of the component recognition cameras 90 (see FIG. 9). The controller 150 has a function for controlling the surface mounter 1.

The axis motors 57 and 47 are connected to the driver 160. The driver 160 has a function to control the axis motors 57 and 47 in response to instructions from the controller 150. The controller 150 issues the instructions to the driver 160 according to the mounting program to control the axis motors and to perform steps for mounting the electronic components B on the printed circuit board P. The feeder 80 and sensors are electrically connected to the controller 150 via the I/O 180. The controller 150 corresponds to "a control portion" in the claimed disclosure.

2. Correction of Errors in Recognition by the Component Recognition Cameras 90

Recognition errors $\Delta X$ and $\Delta Y$ of each component recognition camera 90 differ depending on recognition portions Py of the component recognition camera 90. The differences may occur due to distortions of the mirrors 93 and 94 and the lens 95. In general, the recognition errors $\Delta X$ and $\Delta Y$ are greater at positions away from the center of a field of view (positions away from the center of the image sensor 97) in comparison to the center of the field of view (the center of the image sensor 97 and the center of the lens in the plan view). To improve the recognition accuracy of the component recognition camera 90, it is preferable to reduce the recognition errors $\Delta X$ and $\Delta Y$ that depend on the recognition portions Py of the component recognition camera 90.

In this embodiment, the head unit 60 includes two lines of the mounting heads 63. There are two methods for capturing images of the electronic components B. The method illustrated in FIG. 6A is for capturing images of the electronic components B at two capturing points PA and PB away from the center PO of the field of view at the same time. The method illustrated in FIG. 6B is for capturing images of the electronic components B one at a time at a capturing point PO.

Namely, not only the center of the field of view in which the recognition errors $\Delta X$ and $\Delta Y$ are relatively small but also ends of the field of view in which the recognition errors $\Delta X$ and $\Delta Y$ are relatively large may be used for capturing the images. Therefore, it is preferable to reduce the recognition errors $\Delta X$ and $\Delta Y$ that depend on the recognition positions Py of the camera.

In this embodiment, prior to the start of the production of the printed circuit board P such as in preparation of the production, the recognition errors $\Delta X$ and $\Delta Y$ at the recognition positions Py are measured and stored as correction values CX and CY (the correction data in FIG. 9). The correction values CX and CY are used for correcting the recognition errors $\Delta X$ and $\Delta Y$ to the negative sides. As expressed by equations (1) and (2) provided later, plus or minus signs of the correction values CX and CY are opposite from those of the recognition errors $\Delta X$ and $\Delta Y$. In the production of the printed circuit board P, results of recognition at the recognition positions Py by the component recognition camera 90 are corrected based on the correction values CX and CY obtained in advance to reduce the recognition errors that depend on the recognition positions Py of the component recognition camera 90.

Figure 7:
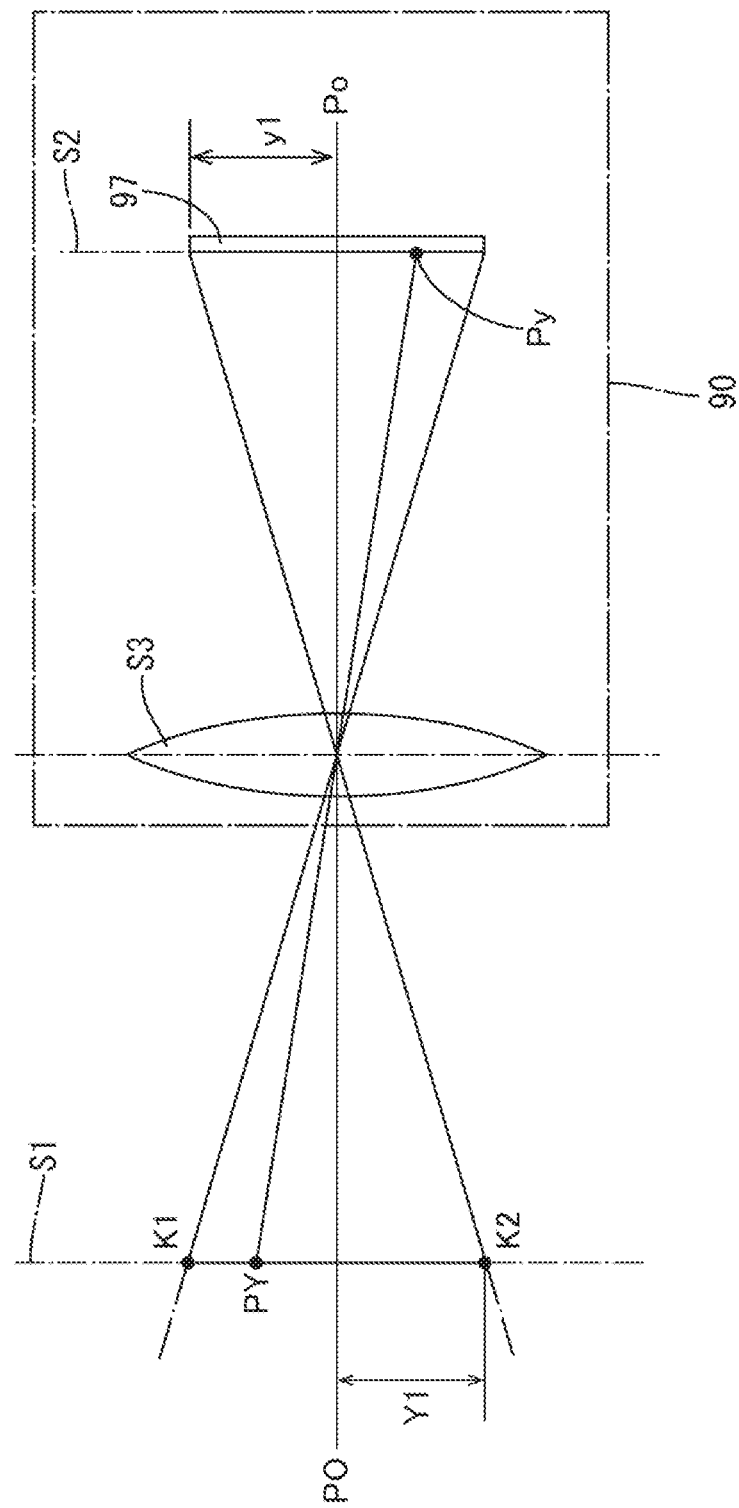
FIG. 7 is a ray diagram illustrating image forming of the camera.

In this description, the recognition positions Py refer to positions of images on the image plane S2, that is, on the image sensor 97 as illustrated in FIG. 7. It is assumed that the images captured by the camera 90 in the same size as the object (y1/Y1=1). If a power of the lens of the camera 90 (y1/Y1) is not one, the position Py of the image is determined after a scale of the image is converted such that the size of the image is equal to the size of the object. If the image of the object is scaled down by the lens S3, exposed on the image sensor, and captured, "Py" is calculated by dividing a distance between the actual exposing position and the center Po of the image sensor (the center of the image) by a reduction ratio (or a magnification ratio). If the power of the lens of the camera 90 is not one, the scale of the image sensor 97 needs to be changed at the same percentage along the conversion of the scale of the image to one.

FIG. 7 is a ray diagram illustrating formation of an image in the camera 90. "S1", "S2", and "S3" denote an object surface (a surface of the mark 67 that is the object), the imaging plane (the imaging area of the image sensor 97), and the lens, respectively. "Po" and "PO" denote the center of the image sensor (the center of the image) and the center of the field of view, respectively. The centers correspond with each other.

"PY" on the object surface S1 and "Py" on the imaging plane S2 denote a capturing position and a recognition position relative to the capturing position PY, respectively. "K1" and "K2" on the object surface S1 denote the edges of the field of view, respectively. The center PO of the field of view is defined as an origin of coordinates of the image captured by the component recognition camera 90. The X-axis direction and the Y-axis direction of the image correspond with the X-axis direction and the Y-axis direction of the surface mounter 1. As illustrated in FIG. 4, in the component recognition camera 90, the mirrors 93 and 94 are disposed between the object and the lens. However, the mirrors 93 and 94 are omitted from FIG. 7.

Next, a method of calculating the correction values (the correction data in FIG. 9) will be described. The calculation is performed prior to the production of the printed circuit board.

First, the marks 67 used for measurement of the recognition errors will be described. The marks 67 are fixed to a lower wall 61 of the head unit 60. As illustrated in FIGS. 6A and 6B, the marks 67 are disposed at the middle of the lower wall 61 in the Y-axis direction and at ends thereof in the X-axis direction. In this embodiment, each mark 67 has a circular shape. For the measurement of the recognition errors, images of only one of the marks 67 may be captured. One of the marks 67 selected as an object to be captured may be referred to as a selected mark.

As illustrated in FIG. 3, images of the selected mark 67 are captured at multiple positions in the field of view of the component recognition camera 90. By moving the head unit 60, the selected mark 67 is moved to the capturing position PY then moved in the X-axis direction to pass the capturing position PY. The image of the mark 67 is captured at the time when the mark 67 is passing the capturing position PY.

The capturing described above is performed at the capturing positions PY while changing the Y coordinate in the field of view of the camera 90. The recognition error ΔX in the X-axis direction and the recognition error ΔY in the Y-axis direction at each recognition position Py are calculated based on the measurements of the selected mark 67 at the corresponding capturing position PY.

Figure 8:
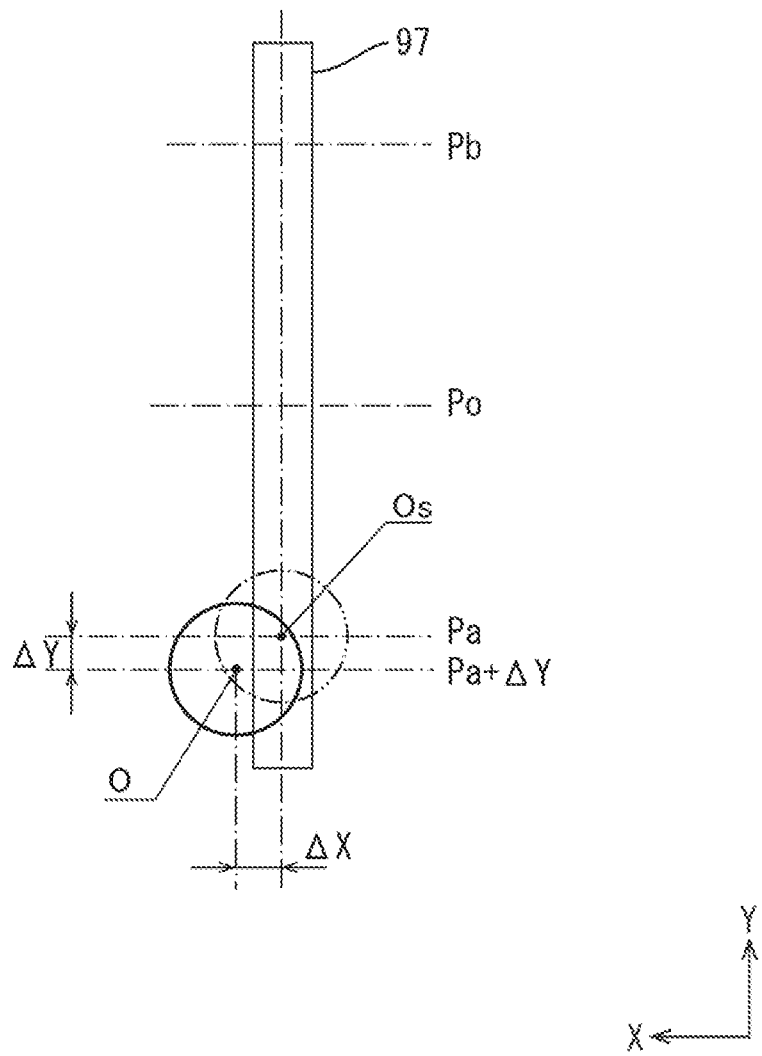
FIG. 8 is an explanatory view illustrating recognition errors.

FIG. 8 illustrates a recognition result from the capturing of the image of the mark 67 at the capturing position PA. "Pa" in FIG. 8 indicates an actual position of the mark 67. "Pa+ΔY" indicates a position of the image, that is, a recognized position of the mark 67. An inverted image is formed on the image sensor 97 due to the action of the lens S3. FIG. 8 illustrates the recognition result that is identified by the image processor 170, that is, the inverted image is processed and converted into the original image.

The recognition errors ΔX and ΔY are errors in the actual recognition result relative to an ideal recognition position defined based on the lens and the mirrors without any distortions. ΔX indicates the recognition error in the X-axis direction at the recognition position Pa+ΔY and ΔY indicates the recognition error in the Y-axis direction at the recognition position Pa+ΔY. As illustrated in FIG. 8, in this embodiment, a deviation of the recognized center O of the mark 67 from the actual center Os of the mark 67 is expressed by the recognition errors ΔX and ΔY.

As expressed by equations (1) and (2), the calculated recognition error "ΔX" is defined as the correction value "$CX_{Pa+\Delta Y}$" at the recognition position Pa+ΔY and the calculated recognition error "ΔY" is defined as the correction value "$CY_{Pa+\Delta Y}$" at the recognition position Pa+ΔY.

$$CX_{Pa+\Delta Y} = -\Delta X \qquad (1)$$

$$CY_{Pa+\Delta Y} = -\Delta Y \qquad (2)$$

The correction value $CX_{Pa+\Delta Y}$ in the X-axis direction and the correction value $CY_{Pa+\Delta Y}$ in the Y-axis direction at the recognition portion Pa+ΔY are obtained. The same processing is performed for the recognition result at each capturing position PY. As a result, the correction value $CX_{Py+\Delta Y}$ in the X-axis direction and the correction value $CY_{Py+\Delta Y}$ in the Y-axis direction at each recognition portion Py+ΔY are obtained.

The recognition positions Py+ΔY are difficult to be handled as data. In this embodiment, the correction value $CX_{Py+\Delta Y}$ at each recognition positions Py+ΔY is approximated by the linear approximation method or the least square method to obtain the correction value $CX_{Py}$ at each recognition portion Py. The correction value $CY_{Py+\Delta Y}$ at each recognition positions Py+ΔY is approximated by the linear approximation method or the least square method to obtain the correction value $CY_{Py}$ at each recognition portion Py. Through the calculations described above, the correction data in FIG. 9 is obtained.

In FIG. 9, the recognition positions Py at 5-mm intervals are present. In the actual image capturing, images of the mark 67 are captured at 1-mm intervals, which will be described later. The correction values in the X-axis direction and the correction values in the Y-axis direction at the recognition positions Py at the 1-mm intervals are obtained. In the following description, the correction values "$CX_{Py}$" and "$CY_{Py}$" at each recognition portion Py are indicated as "CX" and "CY," respectively.

Figure 10:
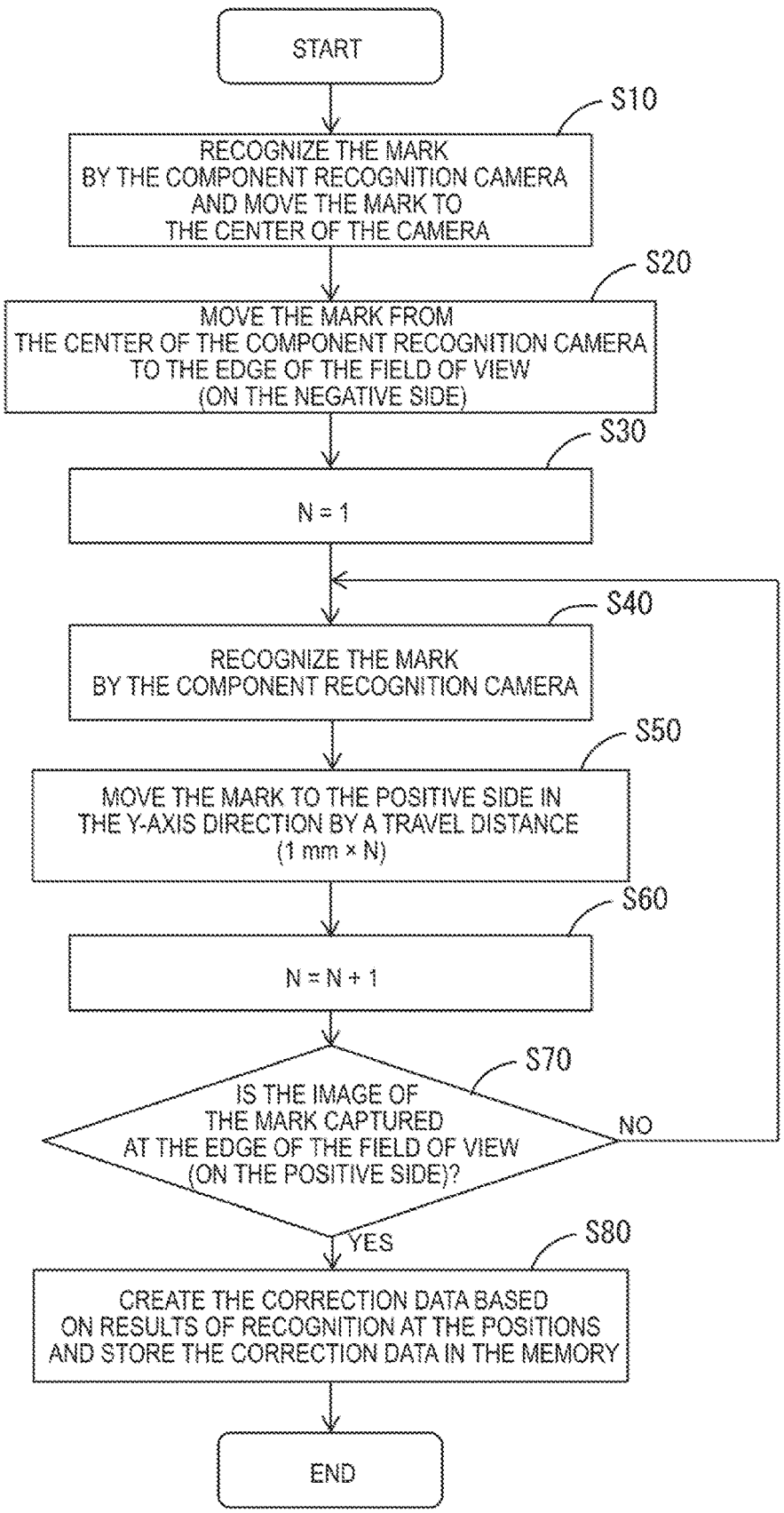
FIG. 10 is a flowchart illustrating steps of creating the correction data.

FIG. 10 is a flowchart illustrating steps of calculating the correction values CX and CY. In step S10, the controller 150 controls the component recognition camera 90 to capture the image of the mark 67 and performs the image recognition process. Then, the mark 67 is moved to the center PO of the field of view of the component recognition camera 90.

In step S20, through control by the controller 150, the mark 67 is moved to the edge of the field of view on the negative side of the component recognition camera. In step S30, a vale of N is set to "1."

In step S40, through control by the controller 150, images of the mark 67 are captured by the component recognition camera 90 while moving the mark 67 in the X-axis direction at the edge of the field of view on the negative side and an image recognition process is performed. Step S40 is an example of "a mark recognition process, a step of recognizing a mark" of the claimed disclosure.

In step S50, through control by the controller 150, the mark 67 is moved to the positive side in the Y-axis direction by a travel distance (1 mm×N). In step S50 performed for the first time, N=1. Therefore, the mark 67 is moved 1 mm from the edge of the field of view on the negative side in the Y-axis direction.

In step S60, the value of N is incremented by "1." Namely, N is set to "2."

In step S70, the controller 150 determines whether the image of the mark 67 is captured at the edge of the field of view on the positive side. At this time, the image of the mark 67 is not captured at the edge of the field of view on the positive side. Therefore, the process returns to step S40 and second mark recognition by the component recognition camera 90 is executed through control by the controller 150.

Namely, the images of the mark 67 are captured by the component recognition camera 90 while moving the mark 67 from the position 1 mm away from the edge of the field of view on the negative side in the X-axis direction, and then recognized. The recognition results at the position about 1 mm away from the edge of the field of view on the negative side are obtained.

Through control by the controller 150, the position of the mark 67 is moved at the 1-mm intervals in the Y-axis direction and images of the mark 67 are captured by the component recognition camera 90 and recognized. The results of the recognition at positions that are 1-mm apart from one another from the edge of the field of view on the negative side are obtained.

The mark 67 reaches the edge of the field of view on the positive side and the image of the mark 67 at that position is captured. After the image of the mark at the edge of the field of view on the positive side is captured, determination is performed step 70 and a result of YES is obtained. The process proceeds to step S80.

In step S80, the controller 150 creates the correction data and stores the correction data in the memory 153. Specifically, the controller 150 calculates the recognition errors ΔX in the X-axis direction and the recognition errors ΔY in the Y-axis direction at the recognition portions Py that are 1 mm apart from one another starting from the edge of the field of view on the negative side based on the results of the recognition at the capturing positions PY that are 1 mm apart from one another starting from the edge of the field of view. The correction values CX in the X-axis direction take the same values as the recognition errors ΔX but the plus and the minus signs are the other way around. The correction values CY in the Y-axis direction take the same values as the recognition errors ΔY but the plus and the minus signs are the other way around. The correction values CX and CY are stored. Step S80 is an example of "a correction value calculation process, a step of calculating correction values" of the claimed disclosure.

As describe earlier, the correction values $CX_{Py+\Delta Y}$ and $CY_{Py+\Delta Y}$ at the recognition positions Py+ΔY are calculated from the results of the recognition. The correction values CX and CY at the recognition positions Py are obtained through the approximation using the linear approximation method or the least square method.

Figure 11:
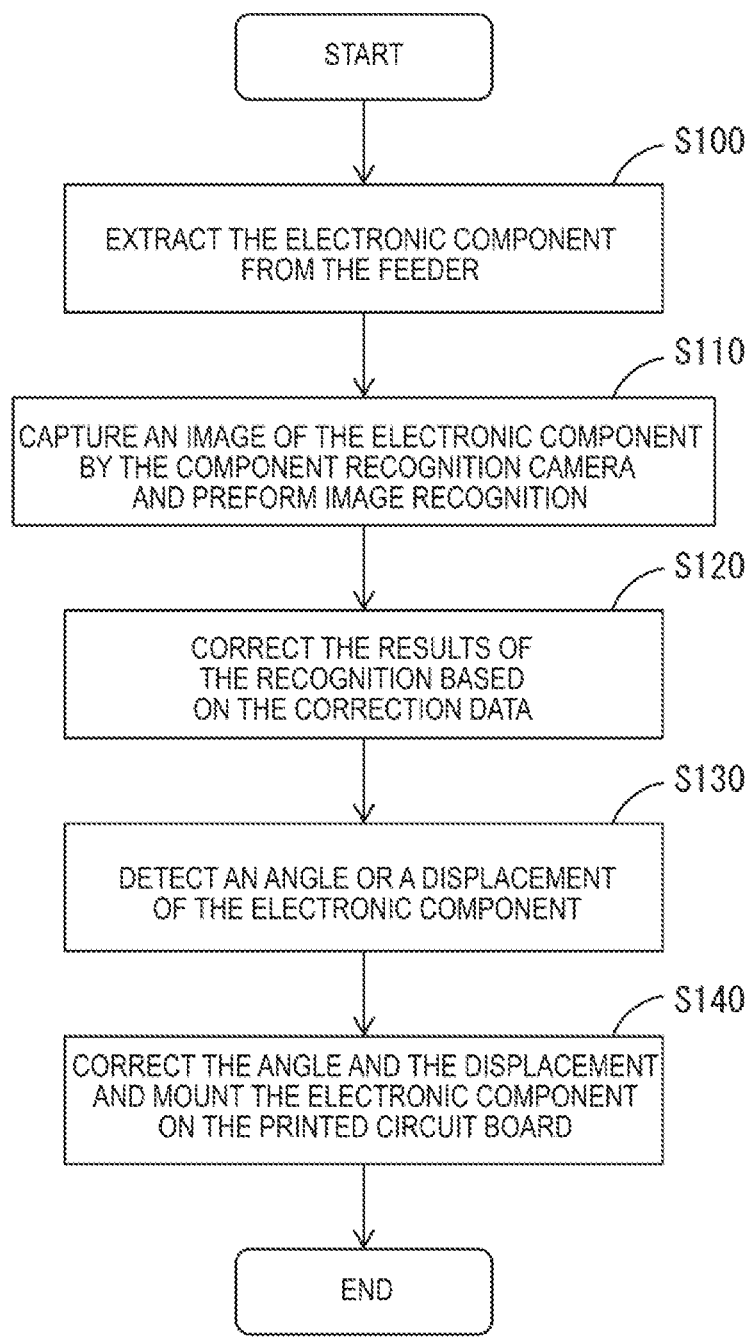
FIG. 11 is a flowchart illustrating steps of mounting an electronic component.

Next, a process of mounting the electronic component B by the surface mounter 1 will be described with reference to FIG. 11.

After the mounting is started, the controller 150 executes a step of extracting the electronic components B from the feeders 80 (S100). Specifically, the controller 150 controls the axis motors 47 and 57 via the driver 160 to move the mounting heads 63 above the feeders 80. Then, the mounting heads 63 are moved down toward a component ejecting positions of the feeders 80 and the electronic component B are extracted from the feeders 80.

The controller 150 controls the axis motors 47 and 57 via the driver 160 to move the electronic components B that are vacuum-held by the mounting heads 63 are moved over the component recognition cameras 90.

As illustrated in FIG. 6A, the head unit 60 is placed such that two lines of the mounting heads 63 separated from each other in the Y-axis direction overlap the field of view of the component recognition camera 90 with respect to the Y-axis direction and moved in the X-axis direction. The images of the electronic components B that are vacuum-held by the mounting heads 63 are captured when the electronic components B pass the component recognition camera 90.

The images of the electronic components B that are vacuum-held by the mounting heads 63 arranged in two lines are captured by the component recognition camera 90 at one time. The controller 150 recognizes the electronic components from the images of the electronic components B (S110). Step S110 is an example of "a mounting related component recognition process, a step of recognizing a mounting related component" of the claimed disclosure.

The controller 150 corrects the recognition results of the electronic components B based on the correction data (S120). The correction values CX and CY corresponding to each recognition position Py are retrieved with reference to the correction data stored in the memory 153. Step S120 is an example of "a correction process, a step of correcting" of the claimed disclosure.

The recognition results at the recognition position Py are corrected using the correction values CX and CY. If the correction values at the recognition portion Py are CX and Cy, an X-coordinate and a Y-coordinate of the recognition result at the recognition position Py are corrected by CX and CY, respectively. This correction is performed for all the results of the recognition at the recognition positions Py. Through the processes, the recognition errors that depend on the recognition positions Py of the component recognition cameras 90 can be reduced.

After the correction of the recognition results of the electronic components B, the controller 150 determines angles of the electronic components B and deviations from vacuum-holding positions based on the corrected recognition results. The angles and the deviations from the vacuum-holding positions are corrected and the electronic components B are mounted on the printed circuit board P.

Effects of the Embodiment

In the surface mounter 1 according to this embodiment, the recognition errors ΔX and ΔY that depend on the recognition positions Py of the component recognition cameras 90 are reduced. Therefore, the recognition accuracy of the component recognition cameras 90 improves and thus the accuracy in mounting of the electronic components B to the printed circuit board P improves.

A method of correcting the recognition errors may include capturing an image of a special jig (ex., a jig including marks at recognition positions) for detecting recognition errors by a camera. According to this embodiment, the errors in recognition by the component recognition camera 90 can be corrected without such a jig.

Figure 12:
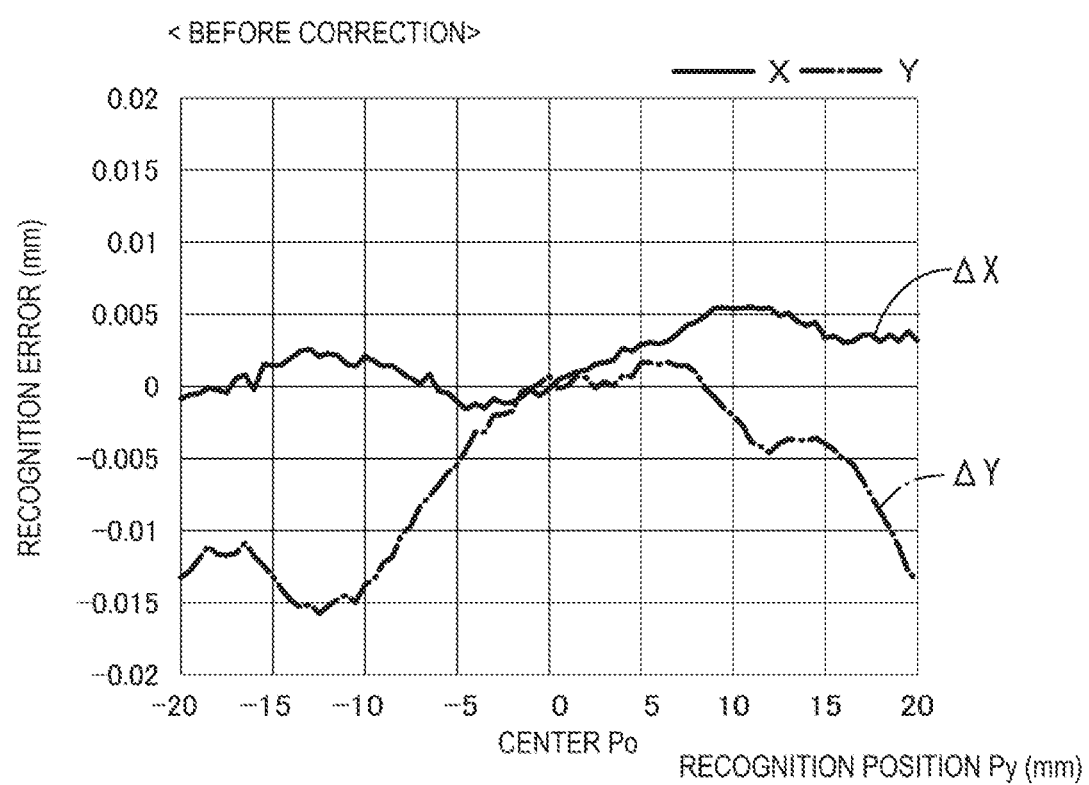
FIG. 12 is a chart illustrating recognition errors of the component recognition camera (before correction)
Figure 13:
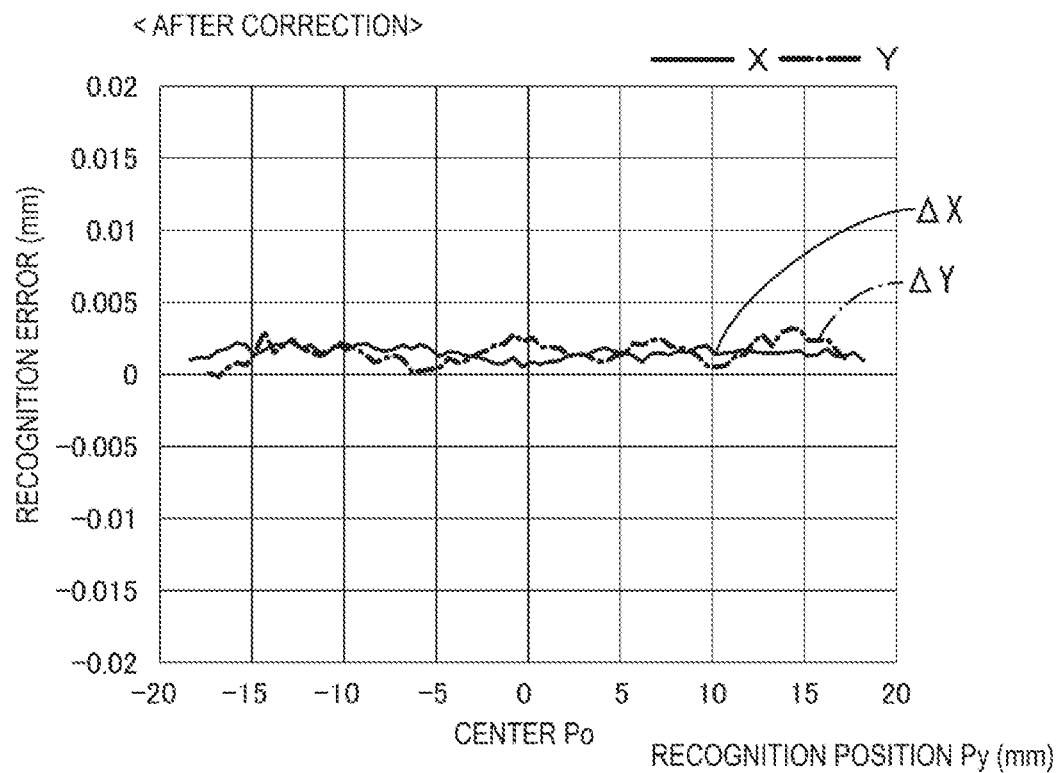
FIG. 13 is a chart illustrating recognition errors of the component recognition camera (after the correction)

FIGS. 12 and 13 are charts illustrating comparison of the recognition errors ΔX and ΔY at the recognition positions Py between before and after the correction. As illustrated in FIG. 12, the recognition errors ΔX and ΔY at the center of the camera are relatively small but the recognition errors ΔX and ΔY at the edges of the field of view of the camera are relatively large before the correction. Namely, the recognition errors ΔX and ΔY at the center are different from those at the edges of the field of view. As illustrated in FIG. 13, after the correction, the recognition errors ΔX and ΔY are reduced in the entire area of the field of view including the edges of the field of view. In the data, the recognition errors ΔX and ΔY that depend on the recognition positions Py are reduced.

Second Embodiment

The first embodiment section describes the configuration for correcting the results of the recognition at the recognition positions Py using the correction values CX and CY to reduce the recognition errors resulting from the distortions of the mirrors 93 and 94 and the lens 95. FIG. 13 illustrates the recognition errors ΔX and ΔY after the correction when there is no or a small variation in inside temperature of the surface mounter 1 since the recognition of the mark by the camera 90. The recognition errors are maintained at a low level for the entire area of the field of view.

The mirrors 93 and 94 and the lens 95 may have distortions when a variation in temperature occurs. Therefore, if the temperature inside the surface mounter 1 has varied since the recognition of the mark by the camera 90, the recognition errors ΔX and ΔY after the correction of the results of the recognition using the same correction values CX and CY may be larger in comparison to an original state in which no variation or a small variation in temperature is present.

Figure 14:
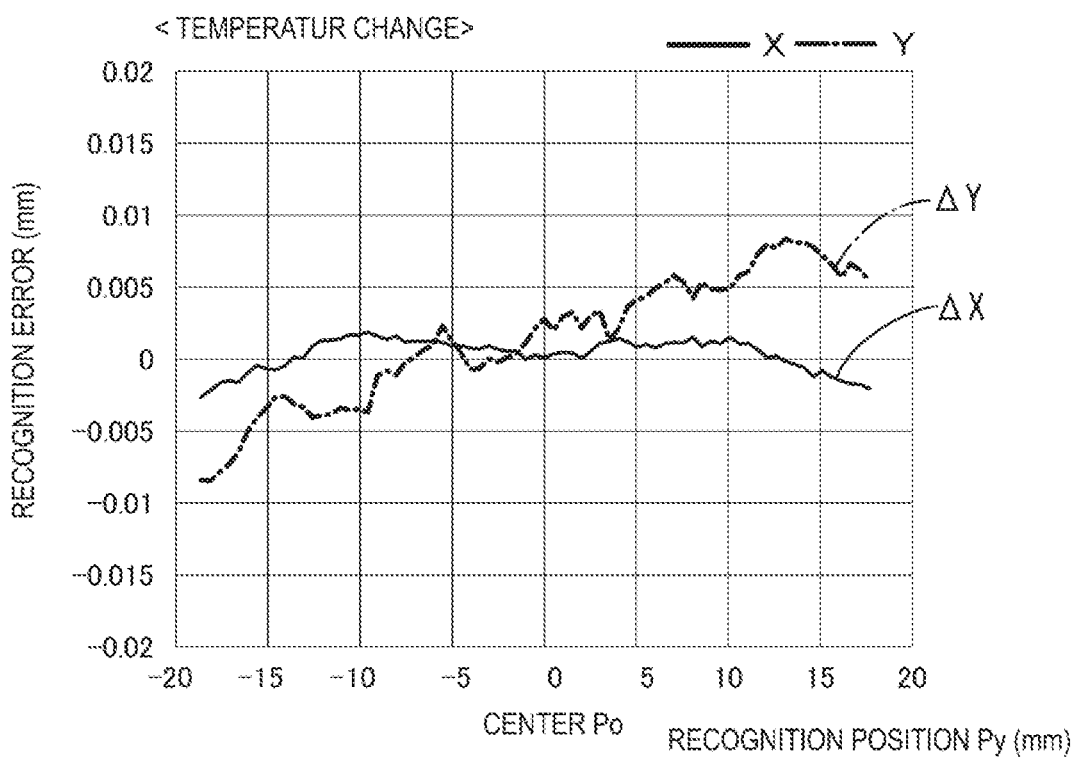
FIG. 14 is a chart illustrating recognition errors of a component recognition camera according to a second embodiment (when a variation in temperature is present)

FIG. 14 illustrates the recognition errors ΔX and ΔY after the correction of the recognition errors by the component recognition camera 90 using correction values CX and CY that are defined before a variation in temperature occurs when the variation in temperature is present. In comparison to FIG. 13, the recognition errors ΔX and ΔY after the correction are larger.

The second embodiment is configured to periodically execute the steps of recognizing the mark 67 by the component recognition camera 90 and steps of updating the correction values CX and CY from obtained results of the recognition.

Figure 15A:
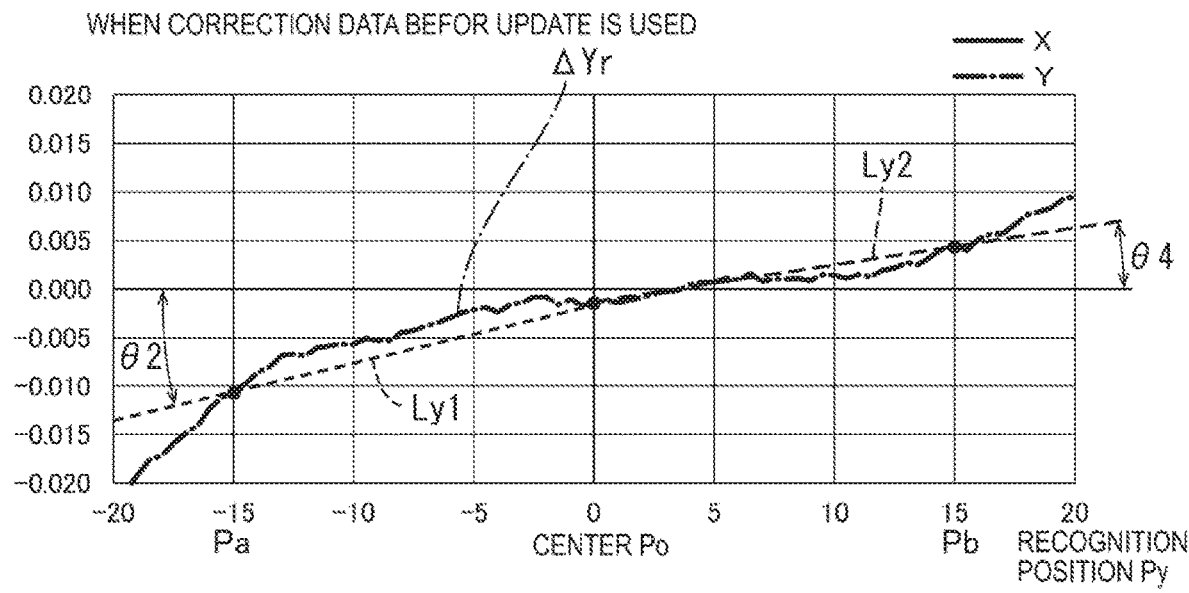
FIGS. 15A and 15B are charts illustrating an approximate straight line of recognition errors.

A graph in FIG. 15A illustrates recognition errors ΔYr after correction of the results of the recognition using the correction values CY that are defined before the update performed when predefined time T has elapsed since the previous recognition of the mark by the component recognition camera 90. A graph in FIG. 15B illustrates recognition errors ΔXr after correction of the results of the recognition using the correction values CX that are defined before the update performed when predefined time T has elapsed since the previous recognition of the mark by the component recognition camera 90.

In the following paragraphs, the recognition errors in the X-axis direction are indicate by ΔXr and the recognition errors in the Y-axis direction are indicated by ΔYr after the correction of the recognition errors using the correction values CX and CY that are defined before the update to distinguish the recognition errors before the correction and the recognition errors after the correction.

Figure 15B:
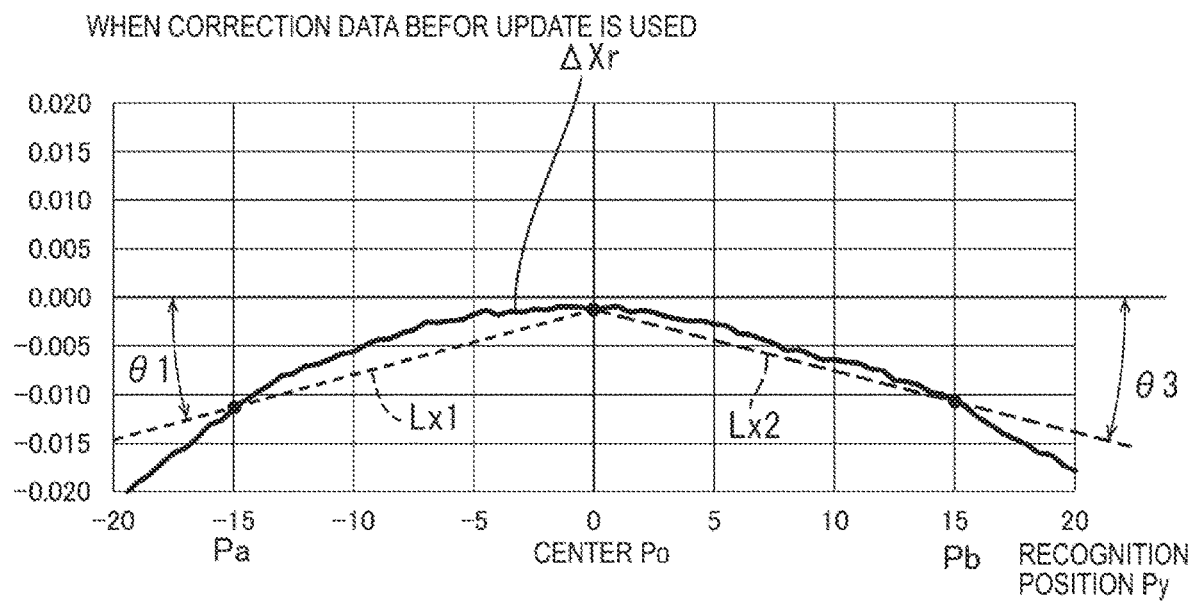

As illustrated in FIGS. 15A and 15B, the recognition errors ΔXr and ΔYr after the correction of the results of the recognition using the correction values CX and CY that are defined before the update tend to increase from the center Po of the image sensor to the edges of the field of view. The recognition errors ΔXr and ΔYr can be approximated with straight lines.

As illustrated in FIG. 15A, the recognition errors ΔYr in the Y-axis direction in a negative region (Py<0) can be approximated with "a first approximation straight line Ly1" and the recognition errors ΔYr in the Y-axis direction in a positive region (Py≥0) can be approximated with "a second approximation straight line Ly2."

"The first approximation straight line Ly1" is a line that connects "the recognition error ΔYr at the center Po of the image sensor" to "the recognition error ΔYr at a recognition position Pa a predefined distance apparat from the center Po of the image sensor on the negative side in the Y-axis direction."

"The second approximation straight line Ly2" is a line that connects "the recognition error ΔYr at the center Po of the image sensor" to "the recognition error ΔYr at a recognition position Pb a predetermined distance apparat from the center Po of the image sensor on the positive side in the Y-axis direction."

In FIG. 15A, θ2 and θ4 indicate gradients of the approximation straight lines Ly1 and Ly2, respectively. A counterclockwise direction with reference to the X-axis is a positive direction. Therefore, the gradient θ2 regarding the recognition positions Py on the negative side and the gradient θ4 regarding the recognition positions Py on the positive side in FIG. 15A take positive values.

As illustrated in FIG. 15B, the recognition errors ΔXr in the X-axis direction in a negative region (Py<0) can be approximated with "a first approximation straight line Lx1" and the recognition errors ΔXr in the X-axis direction in a positive region (Py≥0) can be approximated with "a second approximation straight line Lx2."

"The first approximation straight line Lx1" is a line that connects "the recognition error ΔXr at the center Po of the image sensor" to "the recognition error ΔXr at a recognition position Pa a predetermined distance apparat from the center Po of the image sensor on the negative side in the Y-axis direction."

"The second approximation straight line Lx2" is a line that connects "the recognition error ΔXr at the center Po of the image sensor" to "the recognition error ΔXr at a recognition position Pb a predetermined distance apparat from the center Po of the image sensor on the positive side in the Y-axis direction."

In FIG. 15B, θ1 and θ3 denote gradients of the approximation straight lines Lx1 and Lx2, respectively. A counterclockwise direction with reference to the X-axis is a positive direction. Therefore, the gradient θ1 regarding the recognition positions Py on the negative side takes a positive value and the gradient θ3 regarding the recognition positions Py on the positive side in FIG. 15B takes a negative value.

Figure 16A:
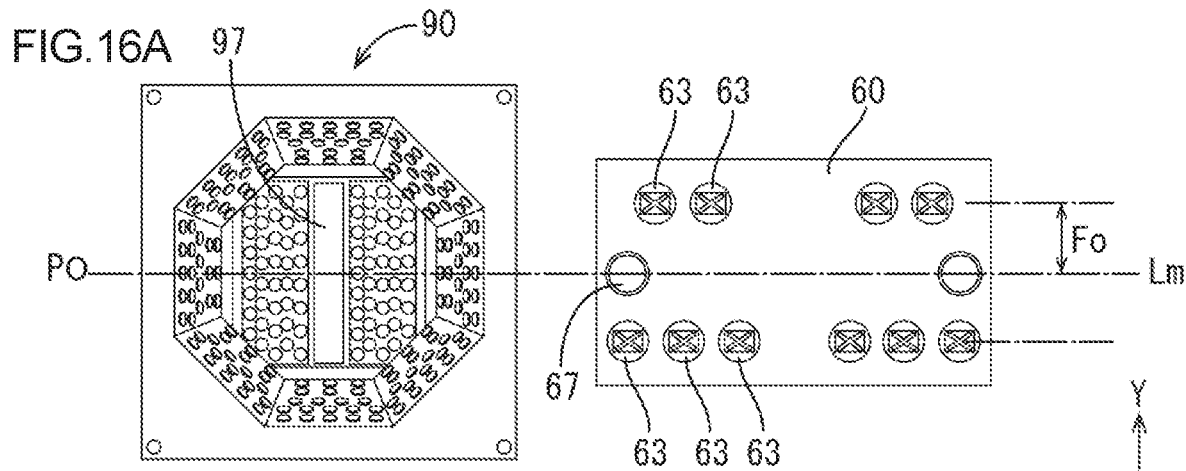
FIGS. 16A, 16B and 16C are views illustrating steps of measuring a mark at three positions.
Figure 16B:
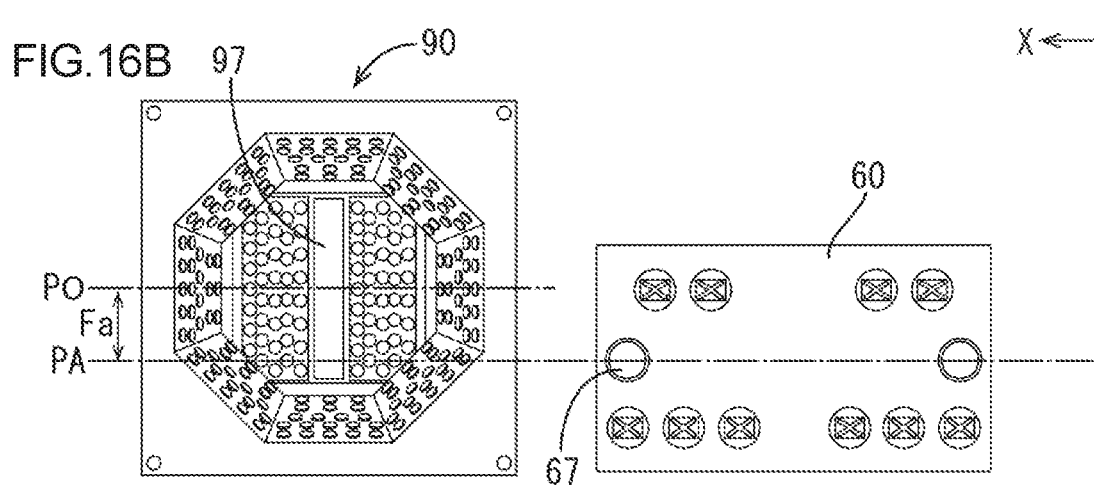
Figure 16C:
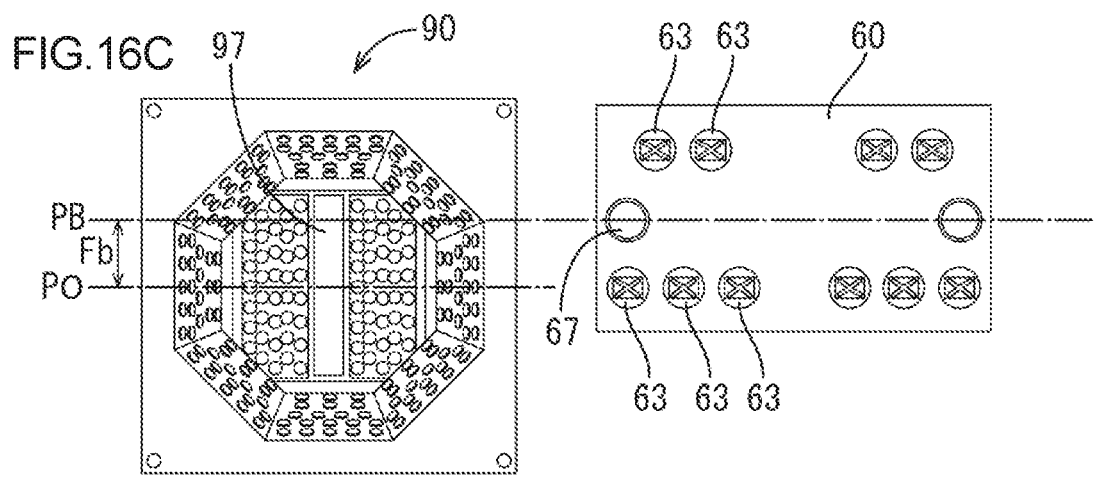

In the second embodiment, the approximation straight lines described above are obtained. Therefore, images of the mark 67 are captured at the following three positions as illustrated in FIGS. 16A to 16C to recognize the mark 67.

(1) The center PO of the field of view of the component recognition camera 90

(2) The image capturing position PA a predetermined distance apart from the center PO on the negative side in the Y-axis direction (3) The image capturing portion PB a predetermined distance apart from the center PO on the positive side in the Y-axis direction.

The capturing position PA corresponds to the recognition position Pa. The capturing position PB corresponds to the recognition position Pb.

Through the image capturing of the mark at the capturing positions PO, PA, and PB, the results of the recognition at the recognition positions Po, Pa, and Pb are obtained. The results of the recognition at the recognition positions Po, Pa, and Pb are corrected using the correction values CX and CY that are defined before the update. The results of the recognition of the corrected results of the recognition of the mark 67 are compared with the actual position of the mark 67. The recognition errors of the mark 67 after the correction, that is, the recognition errors ΔXr in the X-axis direction and the recognition errors ΔYr in the Y-axis direction at the recognition positions Po, Pa, and Pb are calculated.

The recognition errors ΔXr and the recognition errors ΔYr at the recognition positions Po, Pa, and Pb are obtained. Therefore, the approximation straight lines Lx1 and Lx2 to approximate the recognition errors ΔXr in the X-axis direction can be obtained. Furthermore, the approximation straight lines Ly1 and Ly2 to approximate the recognition errors ΔYr in the Y-axis direction can be obtained.

The correction values CX2 and CY2 to correct the recognition errors at the time when the predefined time T has elapsed since the previous recognition of the mark are updated as follows.

If Py<0, the correction values CX2 for the recognition positions Py in the X-axis direction are updated based on coordinates of the recognition positions Py, the gradient θ1 of the approximation straight line Lx1, and the correction values CX1 in the X-axis direction before the update as expressed by equation (3). If Py≥0, the correction values CX2 are updated based on coordinates of the recognition positions Py, the gradient θ3 of the approximation straight line Lx2, and the correction values CX1 in the X-axis direction before the update as expressed by equation (4).

If $Py<0$, $$CX2=Py\times\mathrm{SIN}(-\theta1)+CX1\times\mathrm{COS}(-\theta1) \quad (3)$$

If $Py\geq0$, $$CX2=Py\times\mathrm{SIN}(-\theta3)+CX1\times\mathrm{COS}(-\theta3) \quad (4)$$

CX1 is a correction value for each recognition position Py in the X-axis direction before the update. θ1 is the gradient of the first approximation straight line Lx1. θ3 is the gradient of the second approximation straight line Lx2.

If Py<0, the correction values CY2 for the recognition positions Py in the Y-axis direction are updated based on coordinates of the recognition positions Py, the gradient θ2 of the approximation straight line Ly1, and the correction values CY1 in the Y-axis direction before the update as expressed by equation (5). If Py≥0, the correction values CY2 are updated based on coordinates of the recognition positions Py, the gradient θ4 of the approximation straight line Ly2, and the correction values CY1 in the Y-axis direction before the update as expressed by equation (6).

If $Py<0$, $$CY2=Py\times\mathrm{SIN}(-\theta2)+CY1\times\mathrm{COS}(-\theta2) \quad (5)$$

If $Py\geq0$, $$CY2=Py\times\mathrm{SIN}(-\theta4)+CY1\times\mathrm{COS}(-\theta4) \quad (6)$$

"CY1" is a correction value for each recognition position Py in the Y-axis direction before the update. θ2 is the gradient of the first approximation straight line Ly1. θ4 is the gradient of the second approximation straight line Ly2.

Figure 17A:
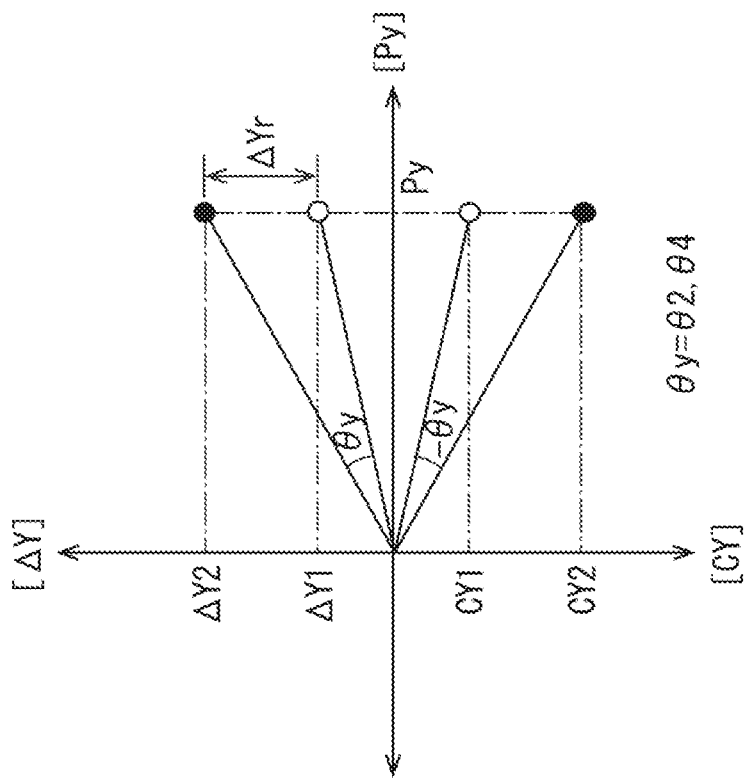
FIGS. 17A and 17B charts illustrating relations among a correction value before update, an angle of an approximate straight line, and a latest correction value.

FIG. 17A is a graph including the horizontal axis that expresses recognition position Py, the positive-side vertical axis that expresses recognition error ΔX, and the negative-side vertical axis that expresses correction value CX. ΔX1 is an uncorrected recognition error relative to the recognition position Py before a variation in temperature occurs. ΔX2 is an uncorrected recognition error after the variation in temperature occurs.

As expressed by equation (7) below, a difference between error ΔX2 and error ΔX1 is about equal to the recognition error ΔXr corrected using the correction value CX1 defined before the update. As illustrated in FIG. 17A, an angle between the strait lines L1 and L2 is about equal to an angle "θx" of an approximation straight line Lx.

$$\Delta Xr=\Delta X2-\Delta X1 \quad (7)$$

The correction value CX1 for the recognition position Py before the update is equal to the recognition error ΔX1 before the variation in temperature occurs but plus and minus signs are the other way around. The correction value CX2 for the recognition position Py before the update is equal to the recognition error ΔX2 before the variation in temperature occurs but plus and minus signs are the other way around. Therefore, an angle between the straight lines L3 and L4 is equal to −θx. Equations (3) and (4) are defined using such relationships.

Figure 17B:
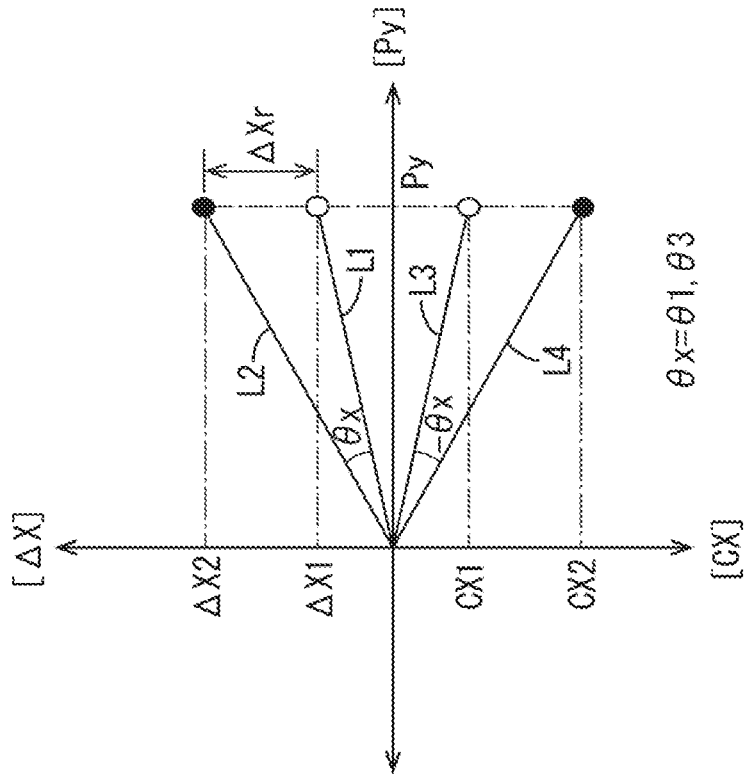

FIG. 17B is a graph including the horizontal axis that expresses recognition position Py, the positive-side vertical axis that expresses recognition error ΔY, and the negative-side vertical axis that expresses correction value CY. Equations (5) and (6) are defined using the relationships described above.

In this embodiment, the latest correction values CX2 and CY2 for the recognition positions are calculated from equations (3) to (6). As illustrated in FIG. 18, the correction values "CX1" in the X-axis direction and the correction values "CY1" in the Y-axis direction for the recognition positions Py are updated to the correction values "CX2" and the correction values "CY2," respectively.

The capturing of the mark 67 at three positions in the component recognition camera 90 is periodically performed to update the correction values CX and CY. According to the configuration, a large increase in recognition error resulting from the distortions of the mirrors and lens due to the variation in temperature is less likely to occur and thus accuracy in recognition by the component recognition camera 90 improves. Therefore, accuracy in mounting of the electronic components B on the printed circuit board P improves.

It is preferable that a distance Fa between the center PO of the field of view and the capturing position PA and a distance Fb between the center PO and the capturing position PB are equal to a distance Fo between the center line Lm of the head unit 60 and the mounting head 63 (see FIGS. 16A through 16C).

According to the configuration, the electronic components B can be recognized at the positions PA and PB at which the recognition errors are measured. Therefore, the recognition errors of the electronic components B can be reduced.

Figure 19:
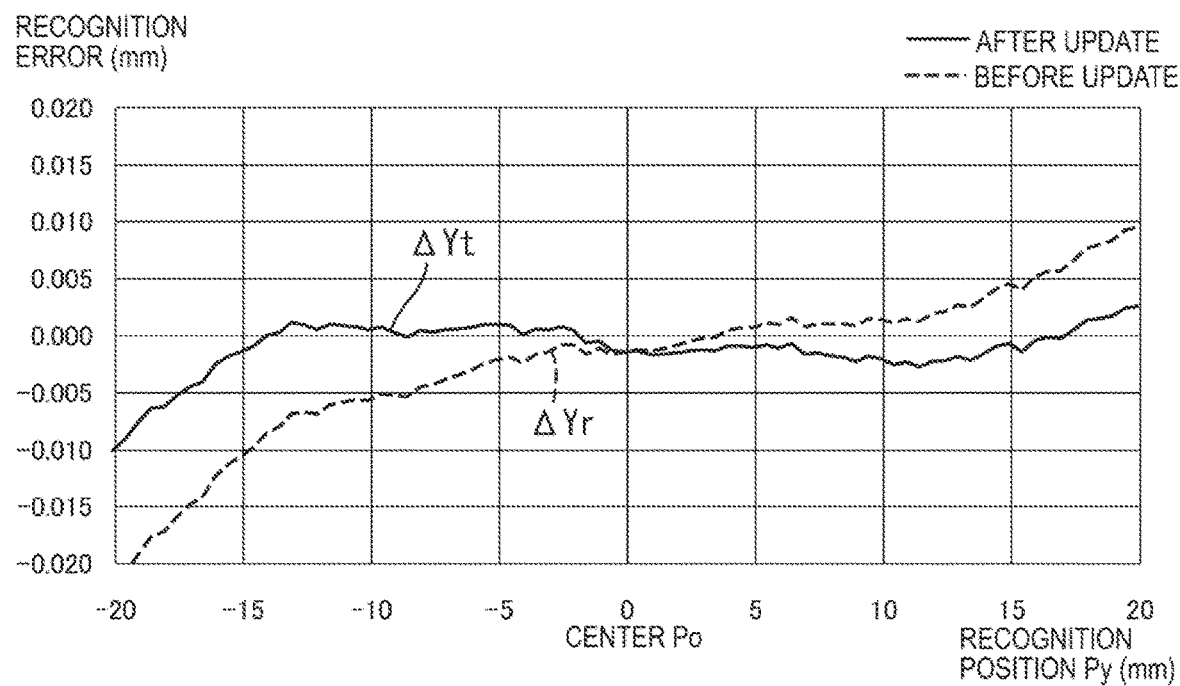
FIG. 19 is a chart illustrating recognition errors of the component recognition camera when correction values before update and correction values after the update are used.

FIG. 19 illustrates a comparison of the recognition errors between when the results of the recognition are corrected using the correction values CX1 and CY1 before the update and when the results of the recognition are corrected using the latest correction values CX2 and CY2 regarding the recognition errors in the Y-axis direction. As illustrated in FIG. 19, the recognition errors ΔYt corrected using the latest correction values CX2 and CY2 are smaller in comparison to the recognition errors ΔYr corrected using the correction values CX1 and CY1 before the update.

Figure 20:
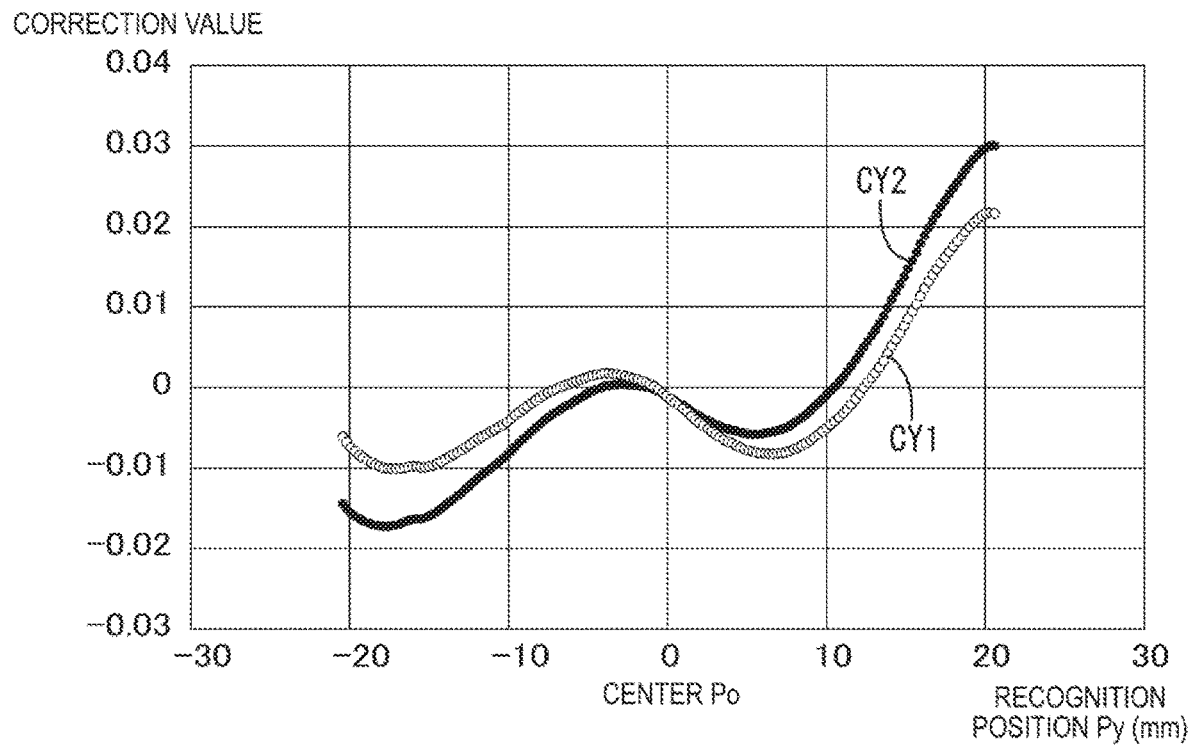
FIG. 20 is a chart illustrating comparison between correction values before and after update.

FIG. 20 illustrates a comparison of amounts of the correction before and after the update. In FIG. 20, white beads on a string express the correction values CY1 before the update and black beads on a string express the latest correction values CY2. The latest correction values CY2 are larger than the correction values CY1 before the update.

Figure 21:
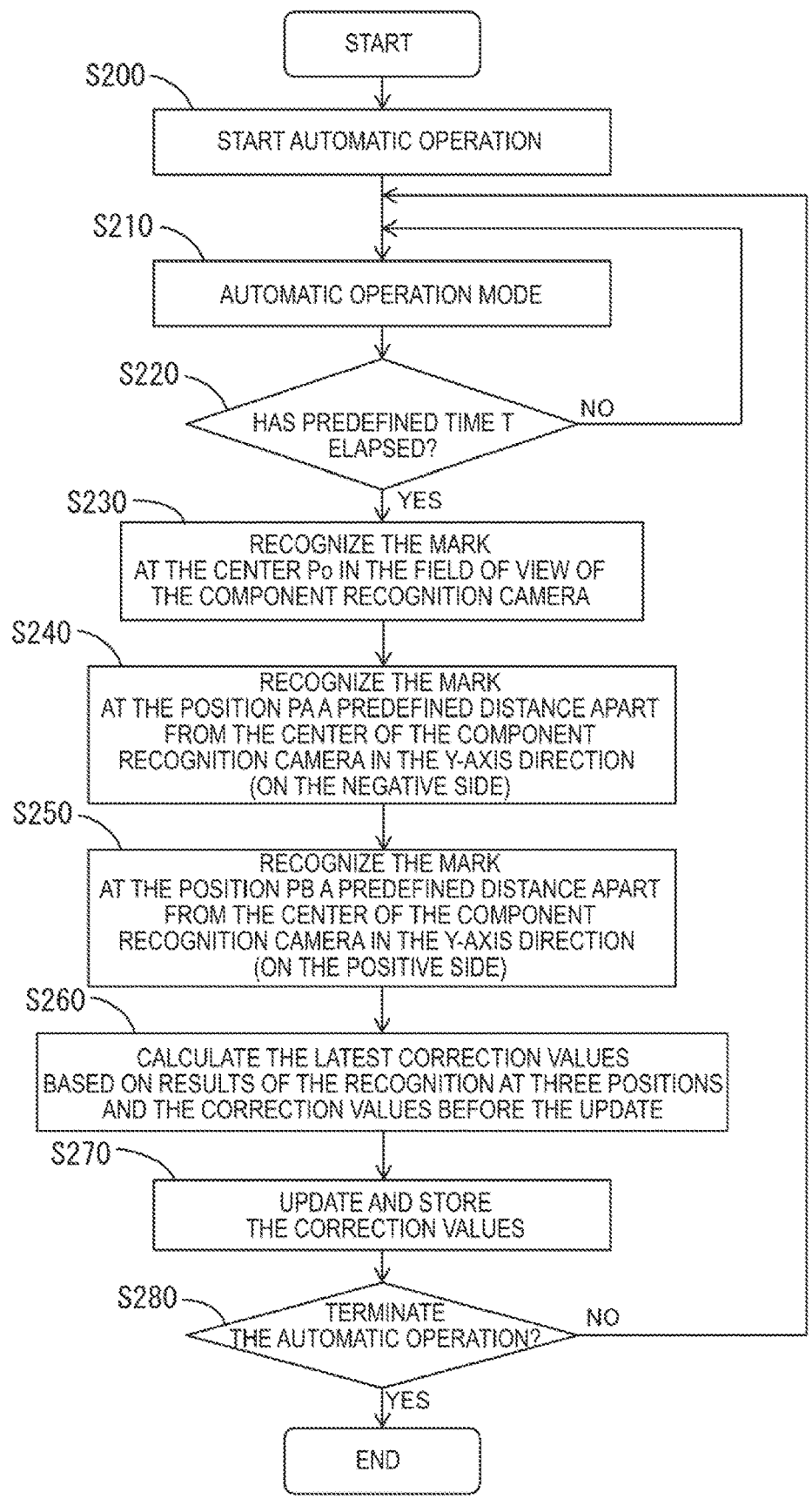
FIG. 21 is a flowchart illustrating steps of periodically updating of correction values.

Next, steps of updating the correction values will be briefly described with reference to FIG. 21. As illustrated in FIG. 21, the surface mounter 1 is set in automatic operation mode after automatic operation is started to start the production of the printed circuit board (S200, S210).

The controller 150 counts an elapsed time since the previous recognition of the mark by the component recognition camera 90 in parallel to the control of the surface mounter 1. The controller 150 determines whether a predefined time T (ex. two hours) since the previous recognition of the mark by the component recognition camera 90 has elapsed (S220).

If it is determined that the predefined time T has not elapsed, a result of step S220 is NO. Therefore, the surface mounter 1 is in automatic operation mode. If it is determined that the predefined time T has elapsed, a result of step S220 is NO and the controller 150 executes steps S230 to S250.

In step S230, the axis motors 47 and 57 are controlled via the driver 160 to move the head unit 60 to toward the component recognition camera. The head unit 60 is moved in the X-axis direction such that the mark 67 crosses the center PO of the field of view of the component recognition camera 90. As illustrated in FIG. 16A, the image of the mark 67 is captured again at the center PO of the field of view of the component recognition camera 90 to perform the image recognition.

In step S240, the head unit 60 is moved in the X-axis direction such that the mark 67 crosses the capturing position PA the predefined distance apart from the center PO of the field of view of the component recognition camera 90 in the Y-axis direction. As illustrated in FIG. 16B, the image of the mark 67 is captured again at the capturing position PA that is the predefined distance apart from the field of view Po of the component recognition camera 90 in the Y-axis direction to perform the image recognition.

In step S250, the head unit 60 is moved in the X-axis direction such that the mark 67 crosses the capturing position PB the predefined distance apart from the center PO of the field of view of the component recognition camera 90. The image of the mark 67 is captured again at the capturing position PB that is the predetermined distance apart from the center PO of the field of view of the component recognition camera 90 in the Y-axis direction to perform the image recognition. Steps S230 and S240 are examples of "a mark recognition process for update, a step of recognizing the mark for update" of the claimed disclosure.

In step S260, the controller 150 calculates the latest correction values CX2 in the X-axis direction and the latest correction values CY2 in the Y-axis direction based on the results of the recognition of the mark 67 at the positions Po, Pa, and Pb and the previous correction values CX1 and CY1.

The results of the recognition at the recognition positions Po, Pa, and Pb are corrected using the correction values CX and CY before the update. The results of the recognition of the mark 67 before the correction are compared with the actual position of the mark 67 to calculate the recognition errors of the mark 67 after the correction, that is, the recognition errors ΔXr in the X-axis direction and ΔYr in the Y-axis direction for the recognition positions Po, Pa, and Pb. Then, the approximation straight lines Lx1, Lx2, Ly1, and Ly2 are defined based on the calculated recognition errors ΔXr and ΔYr for the recognition positions Po, Pa, and Pb. The latest correction values CX2 in the X-axis direction at the recognition positions Py are calculated based on the gradient θ1 of the approximation straight line Lx1, the gradient θ3 of the approximation straight line Lx2, and the correction values CX1 before the update. The latest correction values CY2 in the Y-axis direction at the recognition positions Py are calculated based on the gradient θ2 of the approximation straight line Ly1, the gradient θ4 of the approximation straight line Ly2, and the correction values CY1 before the update.

The controller 150 replace the correction values "CX1" in the X-axis direction with "CX2" and the correction values "CY1" in the Y-axis direction with "CY2" and stores them in the memory 153 (S270). Steps S260 and S270 are examples of "a correction value update process, a step of updating the correction values" of the claimed disclosure.

In step S280, whether to terminate the automatic operation is determined. If the automatic operation is continued, a result of step S280 is NO. The process returns to step S210 and the automatic operation of the surface mounter 1 is continued and the mounting of the electronic components B on the printed circuit board P is performed.

During the mounting of the electronic components B, image recognition of the electronic components B that are vacuum-held by the mounting heads 63 by the component recognition camera to detect angles and deviations. The detected angles and deviations are corrected and the electronic components B are mounted on the printed circuit board P.

When the predefined time T has elapsed since the previous recognition of the mark, the result of the determination in step S220 is YES. Therefore, steps S230 through S270 are executed and the correction values CX and CY are updated. In the second embodiment, the correction values CX and CY are updated every time when the predefined time has elapsed since the previous recognition of the mark. Therefore, even if the variation in temperature in the surface mounter 1 occurs, the errors in recognition by the component recognition camera 90 can be maintained at low levels. The accuracy in mounting of the electronic components B on the printed circuit board P improves.

Other Embodiments

The technology disclosed herein is not limited to the embodiments described above and illustrated by the drawings. For example, the following embodiments may be included in the technical scope of the present disclosure.

(1) The component recognition cameras 90 in the first and the second embodiments are the line sensor cameras. However, the component recognition cameras 90 may be area sensor cameras. To create date including correction values for the area sensor cameras, two-dimensional images of the marks are captured at capturing positions (PX, PY) and recognition errors are calculated for the recognition positions (Px, Py).

(2) In each of the first and the second embodiments, the images of the marks 67 in the head unit 60 are captured and the errors in recognition by the component recognition cameras 90 are corrected. However, the marks 67 may be provided on the stage 10 and images of the marks 67 may be captured by the board recognition camera 65 in the head unit 60 to correct recognition errors of the board recognition camera 65. In this case, it is preferable that results of recognition of the printed circuit board by the board recognition camera 65 are corrected using the correction values for correcting the recognition errors.

(3) In the second embodiment, the approximation straight lines Lx and Ly on the positive side (Py>0) and on the negative side (Py≤0) are separately defined. However, if the gradients of the positive-side straight line and the negative-side straight line substantially correspond with each other such as the approximation straight lines of the Y-axis direction, the approximation straight lines Lx may be expressed by a single straight line or the approximation straight lines Ly may be expressed by a single straight line. In this case, the approximation straight lines Lx and Ly may be defined based on results of recognition of the mark 67 at two positions, for example, at the positions PA and PB. In the second embodiment, the correction values are updated using the previous correction values and the approximation straight lines. However, images of the mark at capturing positions in the field of view of the camera and the correction values may be updated based on recognition errors at the recognition positions calculated from the results of the recognition.

What is claimed is:

1. A surface mounter for mounting an electronic component on a printed circuit board, the surface mounter comprising:
   a stage;
   a mounter including a mark on a lower wall of the mounter, the mounter being movable in a planar direction of the stage to mount the electronic component on the printed circuit board;
   a camera fixed to the stage; and
   a controller comprising:
      a memory storing coordinates of an actual center of the mark at a first recognition position and at a second recognition position on an image plane of the camera; and
      a processor configured to:
         control the mounter to pass a first capturing position in a field view of the camera relative to the first recognition position;
         control the camera to capture an image of the mark when the mark is at the first capturing portion during the mounter is passing the first capturing position;
         perform first image recognition on the image of the mark captured at the first capturing position;
         define coordinates of a center of the mark at the first recognition position from a result of the first image recognition;
         define first deviations of the coordinates of the center of the mark at the first recognition position from the coordinates of the actual center of the mark at the first recognition position stored in the memory;
         calculate first recognition errors at the first recognition position from the first deviations;
         calculate first correction values based on the first recognition errors;
         store the first correction values in the memory;
         control the mounter to pass a second capturing position in a field view of the camera;
         control the camera to capture an image of the mark when the mark is at the second capturing portion during the mounter is passing the second capturing position;
         perform second image recognition on the image of the mark captured at the second capturing position;
         define coordinates of the center of the mark at the second recognition position from a result of the second image recognition;
         define second deviations of the coordinates of the center of the mark at the second recognition position from the coordinates of the actual center of the mark at the second recognition position stored in the memory;
         calculate second recognition errors at the second recognition position from the second deviations;
         calculate second correction values based on the second recognition errors;
         store the second correction values in the memory;
         control the mounter such that the electronic component held by the mounter passes the camera;
         control the camera to capture an image of the electronic component;
         perform image recognition on the image of the electronic component; and
         correct results of the image recognition of the electronic component based on the first correction values and the second correction values stored in the memory.

2. The surface mounter according to claim 1, wherein the camera includes a linear image sensor, the processor is configured to:
   control the mounter to move in a first direction perpendicular to a long dimension of the linear image sensor to pass the first capturing position; and
   control the mounter to move in a second direction perpendicular to the first direction and then move in the first direction to pass the second capturing position after capturing of the image of the mark at the first capturing position is complete.

3. The surface mounter according to claim 2, wherein the first capturing position is between an end of the linear image sensor and a middle of the linear image sensor, and
the second capturing position is between the first capturing position and the middle of the linear image sensor.

* * * * *